(12) United States Patent
Sakoh

(10) Patent No.: US 7,535,043 B2
(45) Date of Patent: May 19, 2009

(54) SOLID-STATE IMAGE SENSOR, METHOD OF MANUFACTURING THE SAME, AND CAMERA

(75) Inventor: Hiroshi Sakoh, Kyotanabe (JP)

(73) Assignee: Panasonic Corporation, Osaka (JP)

( * ) Notice: Subject to any disclaimer, the term of this patent is extended or adjusted under 35 U.S.C. 154(b) by 476 days.

(21) Appl. No.: 11/317,194

(22) Filed: Dec. 27, 2005

(65) Prior Publication Data

US 2006/0138499 A1    Jun. 29, 2006

(30) Foreign Application Priority Data

Dec. 28, 2004   (JP) ............................. 2004-379943

(51) Int. Cl.
*H01L 31/0232* (2006.01)
*H01L 31/18* (2006.01)

(52) U.S. Cl. .................. 257/294; 257/432; 257/440; 257/E31.121; 438/70; 438/73

(58) Field of Classification Search ................. 257/294, 257/432, 440, E31.121; 438/57, 65, 66, 70, 438/73

See application file for complete search history.

(56) References Cited

U.S. PATENT DOCUMENTS

| 5,677,200 | A  | * | 10/1997 | Park et al. ...................... 438/70 |
| 5,796,154 | A  | * | 8/1998  | Sano et al. .................. 257/432 |
| 6,577,342 | B1 |   | 6/2003  | Wester |
| 6,861,280 | B2 | * | 3/2005  | Yamamoto ................... 438/70 |
| 2004/0080008 | A1 | * | 4/2004 | Yamamoto ................... 257/432 |

FOREIGN PATENT DOCUMENTS

JP   5-206429   8/1993

* cited by examiner

*Primary Examiner*—Evan Pert
(74) *Attorney, Agent, or Firm*—Wenderoth, Lind & Ponack, L.L.P.

(57) ABSTRACT

A solid-state image sensor of the present invention is a solid-state image sensor in which pixel cells are arranged on a semiconductor substrate, wherein each of the pixel cells includes: a photoelectric conversion unit that performs photoelectric conversion of incident light; and a microlens formed above the photoelectric conversion unit, the microlens corresponding to the photoelectric conversion unit, wherein the microlens includes a transparent layer and a color filter layer.

13 Claims, 34 Drawing Sheets

(a)

(b)

(c)

(d)

(e)

(f)

(g)

(h)

(i)

(a)

(b)

(c)

(d)

(e)

(f)

(g)

(h)

(i)

(a)

(b)

(c)

(d)

(e)

(f)

(g)

(h)

(i)

( j )

( k )

(a)

(b)

(c)

(d)

(e)

(f)

(g)

(h)

(i)

(j)

(k)

(a)

(b)

(c)

(h)

(i)

(j)

(a)

(b)

(c)

⬇

(h)

(i)

(j)

(a)

(b)

(c)

(d)

(e)

(f)

(g)

(a)

(b)

(c)

(d)

(e)

(f)

(g)

(a)

(b)

(c)

(d)

(e)

(f)

(g)

(h)

(a)

(b)

(c)

(h)

(i)

(j)

(k)

(l)

SOLID-STATE IMAGE SENSOR, METHOD OF MANUFACTURING THE SAME, AND CAMERA

BACKGROUND OF THE INVENTION (1) Field of the Invention

The present invention relates to a solid-state image sensor in which a plurality of pixel cells are arranged, and particularly to a solid-state image sensor and a method of manufacturing the same that improve variations in spectral sensitivity of pixel cells.

(2) Description of the Related Art

Speaking of solid-state image sensors such as a Charge Coupled Device (CCD) sensor, shortening of exit pupil distance between a camera lens and a solid-state image element, and the miniaturization of pixel cells are progressing, along with the miniaturization of cameras and an increase in the pixel count of solid-state image sensors. Such a trend requires the establishment of technology that does not decrease light sensitivity that is the major feature of solid-state image sensors.

FIG. 1 is a cross-sectional view showing two pixel cells of a conventional solid-state image sensor. Photodiodes are two-dimensionally arranged on a semiconductor substrate. A flattening film 2 such as one made of Boron Phosphorus Silicon Glass (BPSG) is formed on the photodiodes 1, and color filters 3 are formed on the flattening film 2. Each of the color filters 3 can be a color filter of a complementary color such as yellow, cyan, magenta, and green, or a color filter of a primary color such as red, green and blue.

Color filter layers have been conventionally formed based on, for example, a dyeing method or a color resist method. In the color resist method, selective exposure and development processing are performed on a photoresist film that contains a colorant or a pigment, so as to form a color filter of intended color. Then, a transparent flattening film 4 is formed below microlenses to reduce the unevenness in the top surface of the color filters after their formation, which results in fewer variations in the form of the microlenses 5.

However, along with the shortening of exit pupil distance between a camera lens and a solid-state image element as well as the reduction in the size of pixels, it has been difficult, with the conventional solid-state image sensor, to reduce the degradation of light sensitivity and mixture of colors of adjacent pixels, by simply using thinner color filters.

According to an improved technology disclosed in the Japanese Laid-Open Application No. 05-206429 (hereinafter referred to as Patent Document 1), it is essential to reduce the distance between the top surface of the semiconductor substrate and the transparent flattening film that is located below the microlenses. To this end, the technology disclosed in Patent Document 1 proposes the use of colored microlenses 6, as shown in FIG. 2, that are capable of functioning also as color filters.

The color filter manufacturing method disclosed in Patent Document 1 makes thinner the film between the top surface of the semiconductor substrate and the flattening film located below the microlenses through the following steps: forming color filters through application, exposure, and development of a color filter resist; depositing a lens formation layer on the color filters; patterning the lens formation layer; forming the patterned lens formation layers into hemispherical shape by performing thermal flow processing or the like; and performing isotropic etching of the hemispherical-shaped resultant.

As described above, there has been proposed the use of colored microlenses so as to have them function as color filters.

SUMMARY OF THE INVENTION

However, the above conventional technology disclosed in Patent Document 1, which has proposed the use of colored microlenses so as to have them function as color filters, has a problem that spectral sensitivity is greatly dependent on F-value. For example, there occur fluctuations in spectral sensitivity depending on F-value (f-stop number), since the optical path length of light, such as vertical light and oblique light, differs depending on its incident angle, the optical path length being the distance over which the light travels in a color filter.

An object of the present invention is to provide a solid-state image sensor, a method of manufacturing the same, and a camera that reduce the dependence of spectral sensitivity on F-value.

In order to achieve the above object, a solid-state image sensor of the present invention is a solid-state image sensor in which pixel cells are arranged on a semiconductor substrate, wherein each of the pixel cells includes: a photoelectric conversion unit that performs photoelectric conversion of incident light; and a microlens formed above the photoelectric conversion unit, the microlens corresponding to the photoelectric conversion unit, wherein the microlens includes a transparent layer and a color filter layer.

With this structure, since not the whole of each microlens also serves as a color filter but only one of the two layers making up the microlens also serves as a color filter, it is possible to reduce variations in optical path length that are attributable to different angles at which incident light passes through the color filter layer. This makes it possible to obtain spectral sensitivity with fewer variations regardless of whether incident light is oblique light or vertical light, and thus to reduce fluctuations in spectral sensitivity that depends on F-value.

Here, the color filter layer may be formed under the transparent layer in a manner that the color filter layer serves as a bottom surface of the microlens, and a thickness of the color filter layer in each of the pixel cells may be uniform within the color filter layer.

Here, the color filter layer in each of the pixel cells may be greater in thickness in a center than in a periphery of the color filter layer.

With this structure, it is possible to further suppress variations in spectral sensitivity, since variations in optical path length in a color filter layer that are attributable to different angles of incident light can be further reduced.

Here, the transparent layer may have a lens shape in which a bottom surface of the transparent layer is formed in an inner side of a bottom surface of the microlens and serves as a part of the bottom surface of the microlens, and a height of the transparent layer is less than a height of the microlens, and the color filter layer may be formed on the transparent layer in a manner that the color filter layer covers a top surface of the transparent layer.

Also with this structure, it is possible to suppress variations in spectral sensitivity that are attributable to different angles of incident light, since there are further fewer variations in optical path length in a color filter layer that are attributable to different angles of incident light.

Here, a thickness of the color filter layer may range from a quarter to two-thirds of a thickness of the microlens.

Furthermore, a method of manufacturing a solid-state image sensor of the present invention is a method of manufacturing a solid-state image sensor in which pixel cells are arranged on a semiconductor substrate, the pixel cells including (a) respective photoelectric conversion units operable to perform photoelectric conversion of incident light, and (b) microlenses formed above the respective photoelectric conversion units, the microlenses corresponding to the respective photoelectric conversion units, the method including: forming the photoelectric conversion units on the semiconductor substrate; forming a flattening film on the photoelectric conversion units; and forming, on the flattening film, the microlenses corresponding to the respective photoelectric conversion units, each of the microlenses including a transparent layer and a color filter layer.

According to the solid-state image sensor of the present invention, where a color filter layer and a microlens are formed in an integrated form and a color filter layer is formed either as the bottom part of the corresponding microlens or on the outer surface of the corresponding microlens, there are fewer fluctuations in spectral sensitivity depending on F-value since there are fewer variations in optical path length, being the distance over which light travels in a color filter, which are attributable to different angles of incident light. As a result, it is possible to reduce variations or fluctuations in spectral sensitivity regardless of whether incident light is vertical light or oblique light.

The disclosure of Japanese Patent Application No. 2004-379943 filed on Dec. 28, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

First Embodiment

Figure 3:
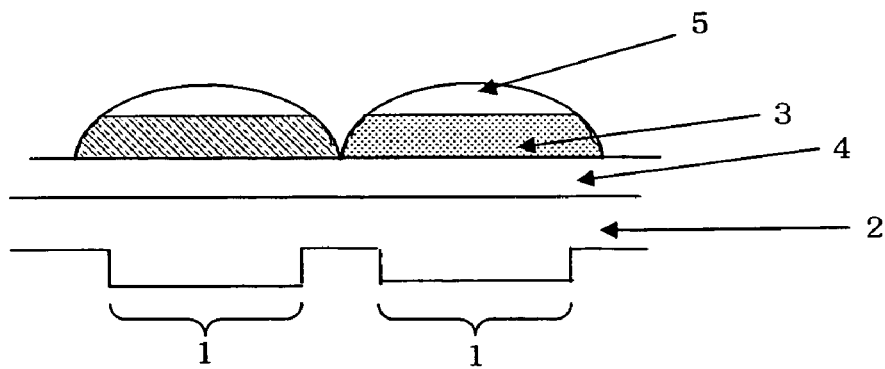
FIG. 3 is a cross-sectional view of a solid-state image sensor according to a first embodiment.
Figure 4:
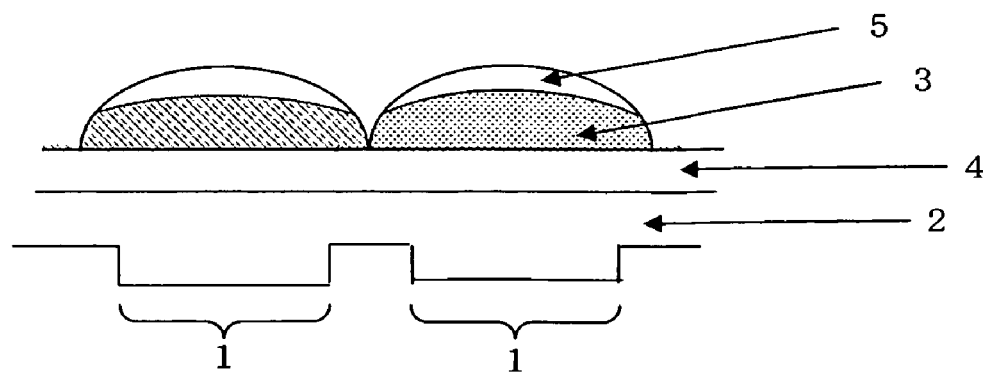
FIG. 4 is a cross-sectional view of a solid-state image sensor according to a second embodiment.
Figure 5:
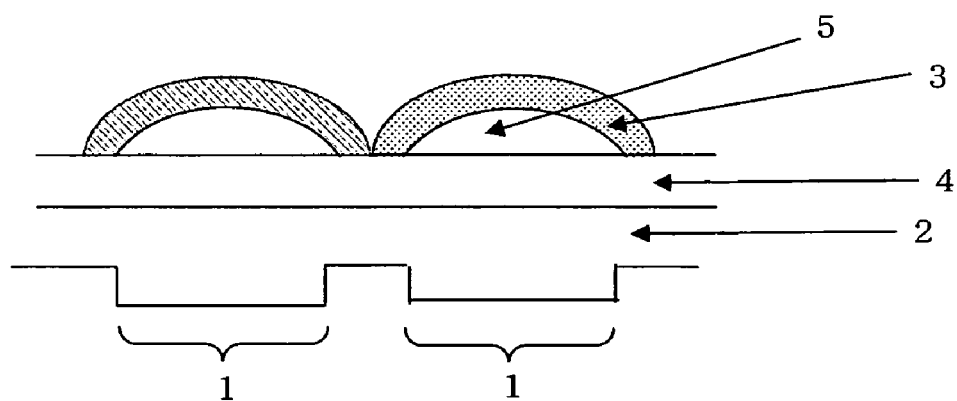
FIG. 5 is a cross-sectional view of a solid-state image sensor according to a third embodiment.

The following describes the solid-state image sensor of the first embodiment of the present invention with reference to the drawings. FIGS. 3 to 5 are diagrams, each showing the structure of the solid-state image sensor of each of the first to third embodiments. In the solid-state image sensor shown in these diagrams, a film made of BPSG or the like is formed on the surface of photodiodes 1 to flatten the surface of the photodiodes 1, and color filters are formed as part of microlenses.

The following describes the structures shown in FIGS. 3 to 5 and their effects, respectively. FIG. 3 shows a structural example of the solid-state image sensor according to the first embodiment. A flattening film 2 made of BPSG or the like is formed on the surface of the photodiodes 1. Then, a transparent film 4 made of acryl or the like is formed on the surface of the flattening film 2 such that the thickness of the transparent film 4 ranges from 0.1 to 10 μm depending on need. After this, the bottom parts of the respective microlenses 5 are formed by color filters 3 such that the thickness of each of the color filters 3 becomes uniform within such color filter layer 3 in the range between a quarter and two-thirds of the height of the corresponding microlens 5. Furthermore, the top parts of the respective microlenses 5 are formed on the corresponding color filters 3.

Figure 1:
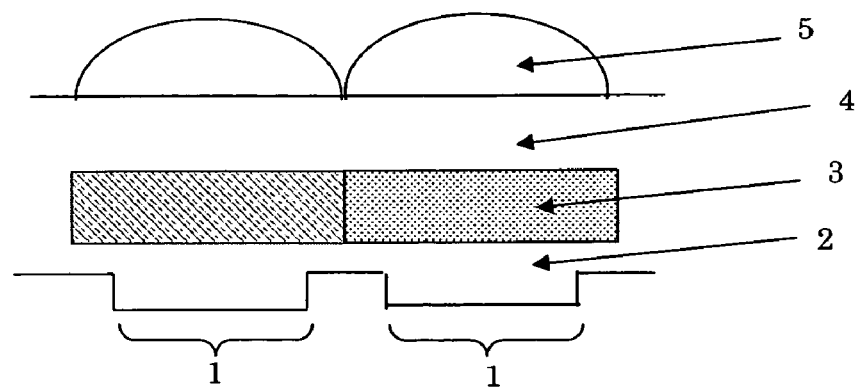
FIG. 1 is a cross-sectional view of a conventional solid-state image sensor.
Figure 2:
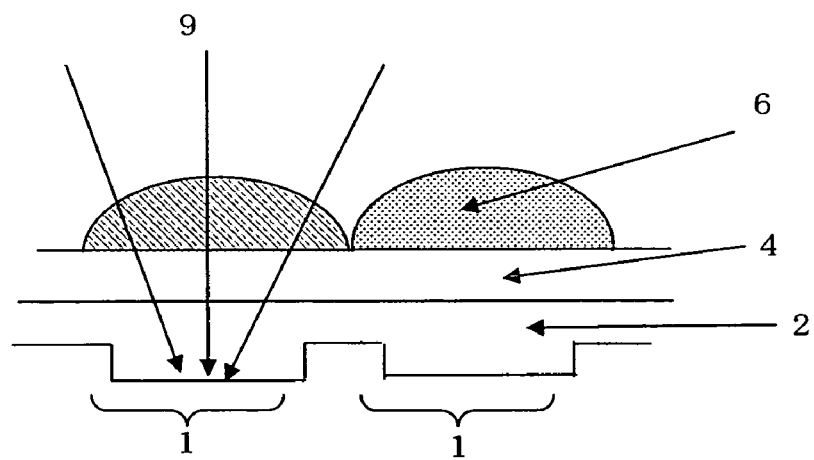
FIG. 2 is a cross-sectional view of a structure in which microlenses function as color filters.

As shown in FIG. 3, since the color filters 3, each of which has a uniform thickness within such color filter 3, form the bottom parts of the respective microlenses 5, it becomes difficult for light, when it is an oblique light incident at an angle, to enter via the edge of a color filter of an adjacent pixel, as compared to a conventional structure shown in FIG. 1 in which color filters and microlenses are separately formed. As a result, a mixture of colors is suppressed, which is effective in the prevention of color shading and inconsistencies in color density among lines. What is more, the structure of the solid-state image sensor of the first embodiment has advantages that variations in spectral sensitivity that are attributable to different light incident angles are reduced and that dependence of spectral sensitivity on F-value becomes smaller, as compared to the structure shown in FIG. 2 in which the microlens themselves function as color filters.

Second Embodiment

FIG. 4 shows a structural example of the solid-state image sensor according to the second embodiment. A film 2 made of BPSG or the like is formed on the surface of photodiodes 1. Then, a transparent film 4 made of acryl or the like is formed on the surface of the film 2 such that the thickness of the transparent film 4 ranges from 0.1 to 10 μm depending on need. After this, the bottom parts of the respective microlenses 5 are formed by color filters 3 such that the thickness of each of the color filters 3 ranges from a quarter to two-thirds of the height of the corresponding microlens 5. Furthermore, the top parts of the respective microlenses 5 are formed on the corresponding color filters 3.

As shown in FIG. 4, since each of the color filters 3 is formed such that its thickness is greater in the cell center and less in the cell periphery, it becomes difficult for light, when it is an oblique light incident at an angle, to enter via the edge of a color filter of an adjacent pixel, as compared to a conventional structure shown in FIG. 1 in which color filters and microlenses are separately formed. As a result, a mixture of colors is suppressed, which is effective in the prevention of color shading and inconsistencies in color density among lines. What is more, the structure of the solid-state image sensor of the second embodiment has advantages that variations in spectral sensitivity that are attributable to different light incident angles are reduced and that the dependence of spectral sensitivity on F-value becomes smaller, as compared to the structure shown in FIG. 2 in which the whole of the microlenses function as color filters. Moreover, the structure of the second embodiment can further suppress variations in spectral sensitivity, as compared to the structure of the first embodiment, since there are fewer variations in optical path length in the color filters 3 that are attributable to different light incident angles.

Third Embodiment

FIG. 5 shows a structural example of the solid-state image sensor according to the third embodiment. A film 2 made of BPSG or the like is formed on the surface of photodiodes 1. Then, a transparent film 4 made of acryl or the like is formed on the surface of the film 2 such that the thickness of the transparent film 4 ranges from 0.1 to 10 μm depending on need. After this, microlenses 5 are formed on the transparent film 4 first, and then the outer surfaces of the respective microlenses 5 are covered with color filters 3, producing the final shape of the microlenses.

As shown in FIG. 5, by covering the outer surfaces of the respective microlenses 5 with color filters 3, it becomes difficult for light, when it is an oblique light incident at an angle, to enter via the edge of a color filter of an adjacent pixel, as compared to a conventional structure shown in FIG. 1 in which color filters and microlenses are separately formed. As a result, a mixture of colors is suppressed, which is effective in the prevention of color shading and inconsistencies in color density among lines. What is more, the structure of the solid-state image sensor of the third embodiment has advantages that variations in spectral sensitivity that are attributable to different light incident angles are reduced and that the dependence of spectral sensitivity on F-value becomes smaller, as compared to the structure shown in FIG. 2 in which the microlens themselves function as color filters. Moreover, the structure of the third embodiment can further suppress variations in spectral sensitivity that are attributable to different light incident angles, as compared to the structures of the first and second embodiments, since there are fewer variations in optical path length in the color filters 3 that are attributable to different light incident angles.

(Manufacturing Method)

Next, a description is given of a method of manufacturing color filters of the solid-state image sensors respectively shown in FIGS. 3 to 5.

Figure 6A:
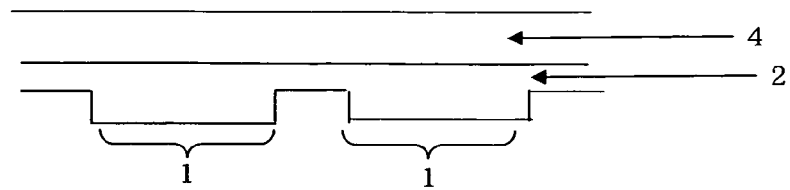
FIG. 6A to FIG. 6C are diagrams, each showing a first method of manufacturing the solid-state image sensor shown in FIG. 3.
Figure 6A:
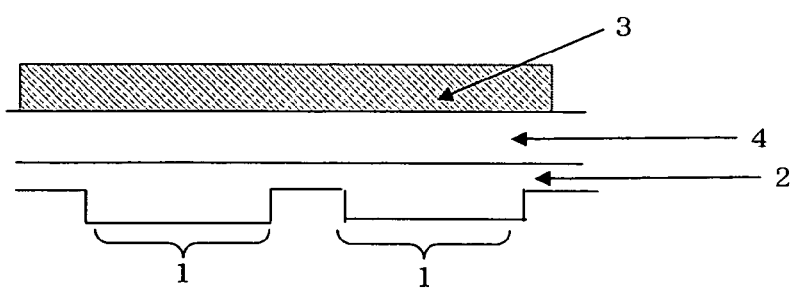
Figure 6A:
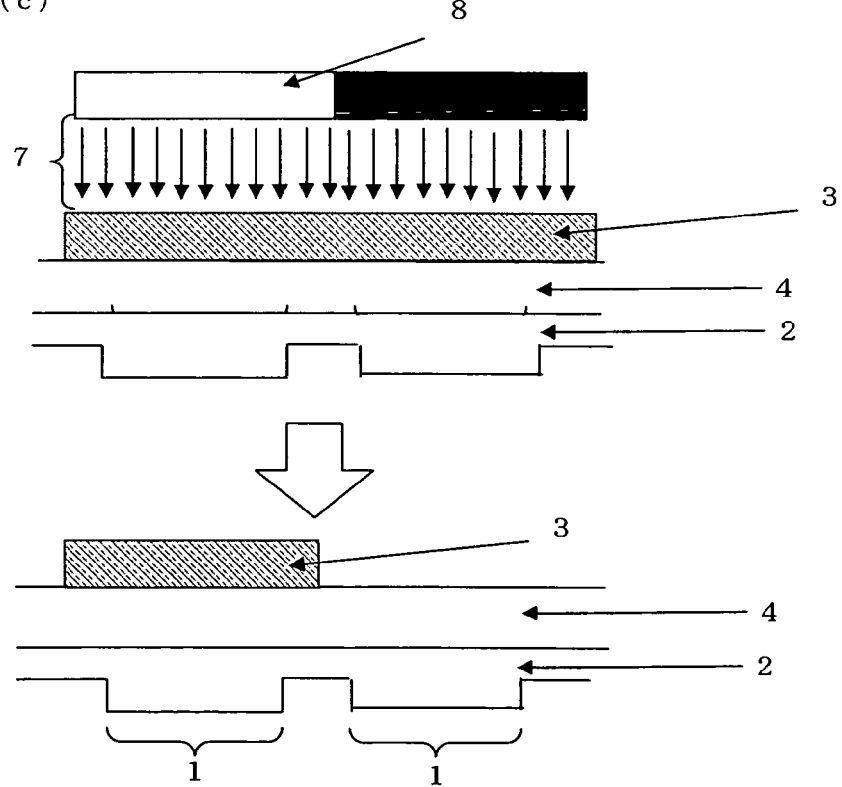
Figure 6B:
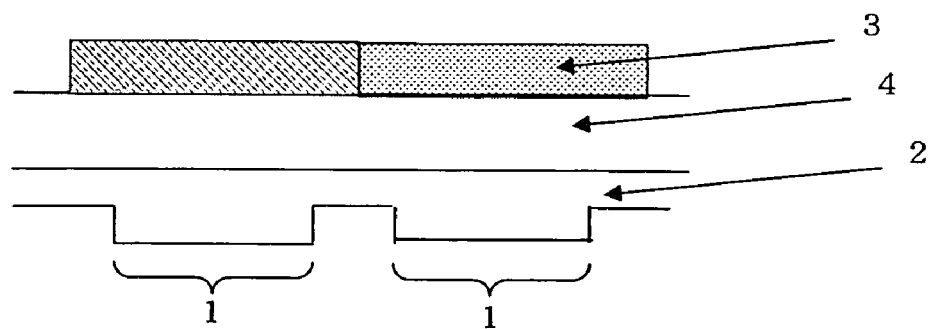
Figure 6B:
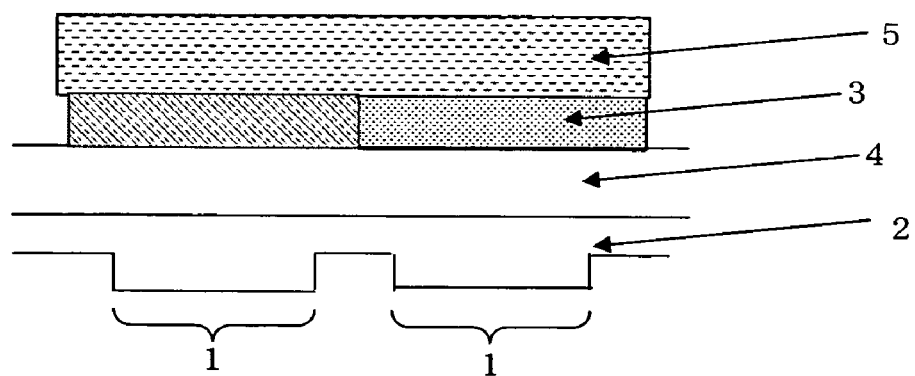
Figure 6B:
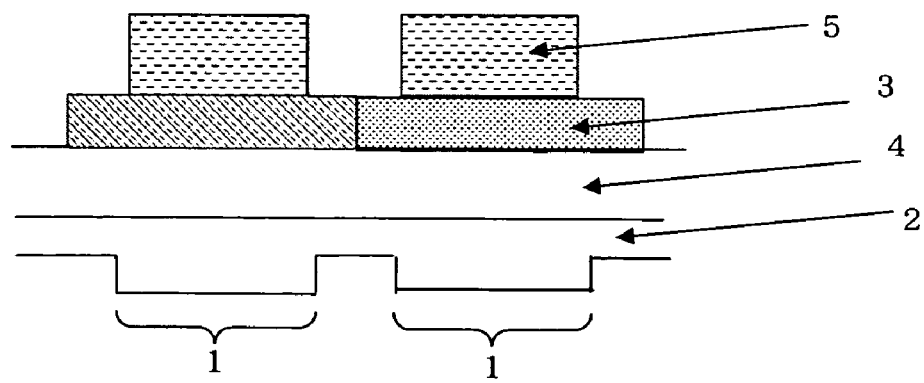
Figure 6C:
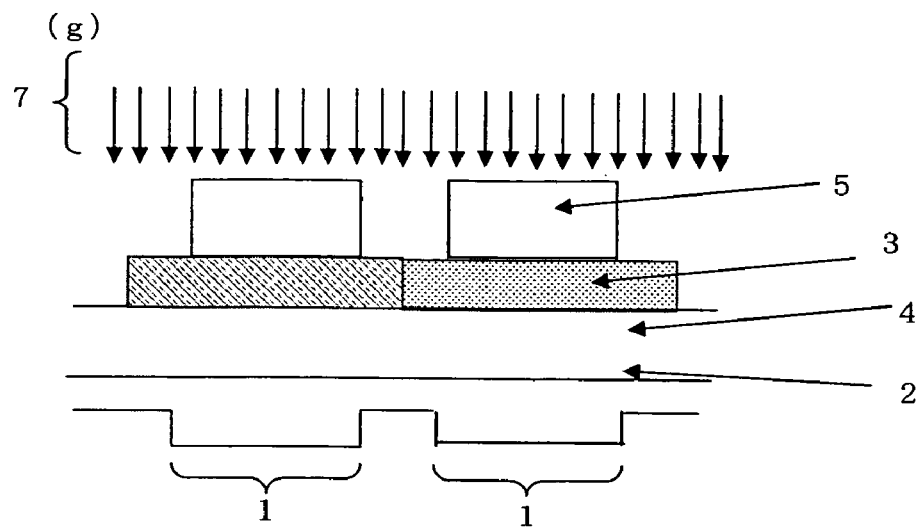
Figure 6C:
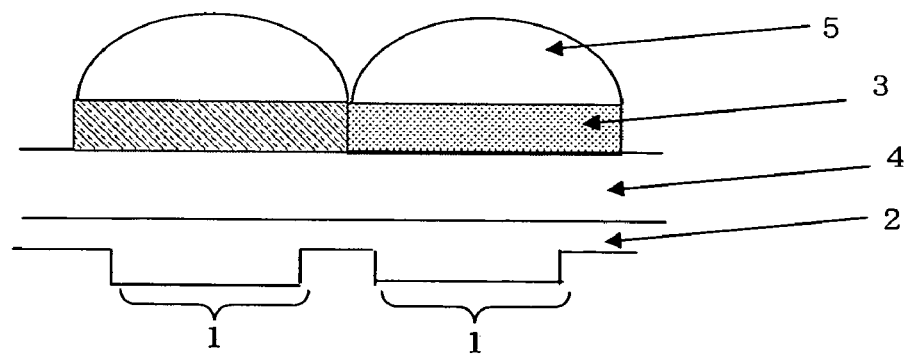
Figure 6C:
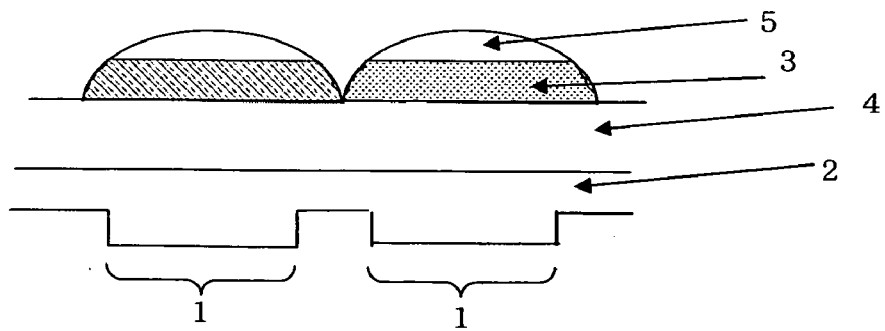

FIGS. 6A to 6C are diagrams for describing a first method of manufacturing the solid-state image sensor shown in FIG. 3. First, referring to FIGS. 6A to 6C, a description is given of a method of manufacturing the solid-state image sensor of the first embodiment shown in FIG. 3. Referring to FIG. 6A(a), a film 2 made of BPSG or the like is formed on the surface of photodiodes 1, and then a transparent film 4 made of acryl or the like is formed on the surface of the film 2 such that the thickness of the transparent film 4 ranges from 0.1 to 10 μm depending on need. Referring to FIG. 6A(b), a color filter resist is applied onto the transparent film 4, and then referring to FIG. 6A(c), patterned color filter resists 3 are formed by performing exposure and development of the color filter resist. When this is done, the color filters 3 are formed such that their thickness ranges from a quarter to two-thirds of the final height of the corresponding microlenses 5. Then, referring to FIG. 6B(d), the same application, development, and exposure of a color filter resist as described above are carried out for color filters 3 of the respective colors, so as to form a color filter layer.

Furthermore, referring to FIG. 6B(e), a microlens resist is applied on the color filters 3, and referring to FIG. 6B(f), patterned microlens resists 5 are formed by performing exposure and development of the microlens resist. Furthermore, referring to FIG. 6C(g), the patterned microlens resists 5 are decolorized by ultraviolet radiation, and referring to FIG. 6C(h), the patterned microlens resists 5 are formed into the shape of microlenses by performing thermal flow processing. Finally, referring to FIG. 6C(i), microlenses 5 are formed by etching back the microlens-shaped resists from the above so as to transfer the shape of the microlenses 5 to the color filters.

Figure 7A:
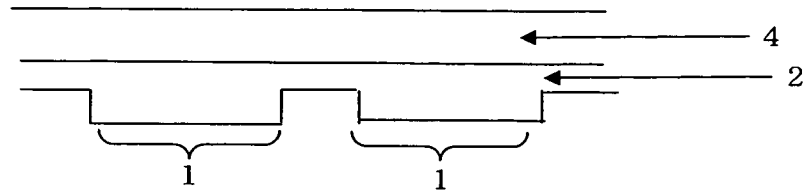
FIG. 7A to FIG. 7C are diagrams, each showing a second method of manufacturing the solid-state image sensor shown in FIG. 3.
Figure 7A:
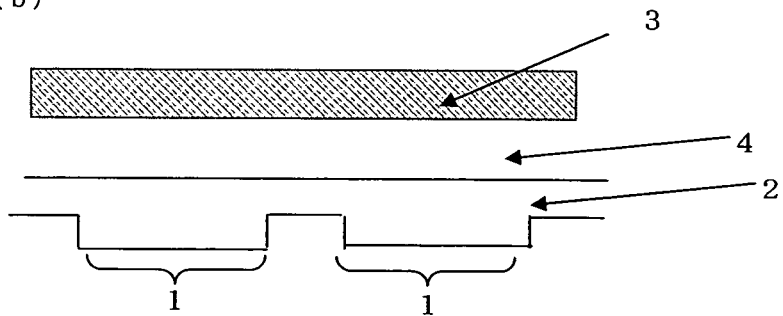
Figure 7A:
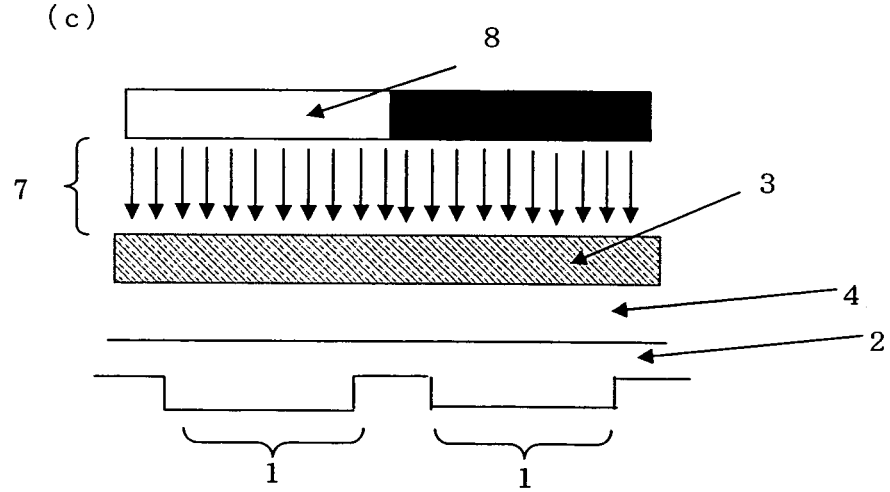
Figure 7A:
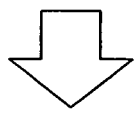
Figure 7A:
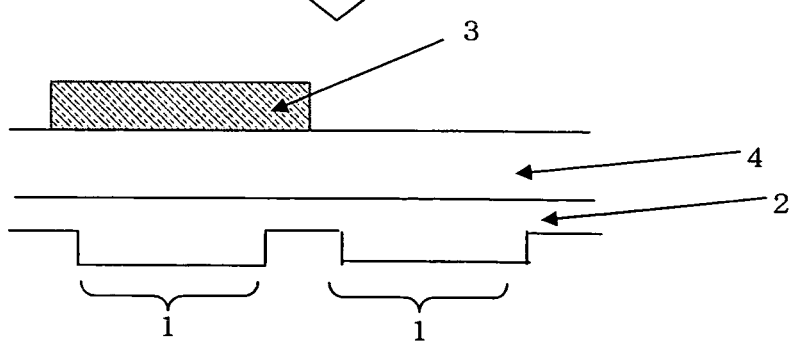
Figure 7B:
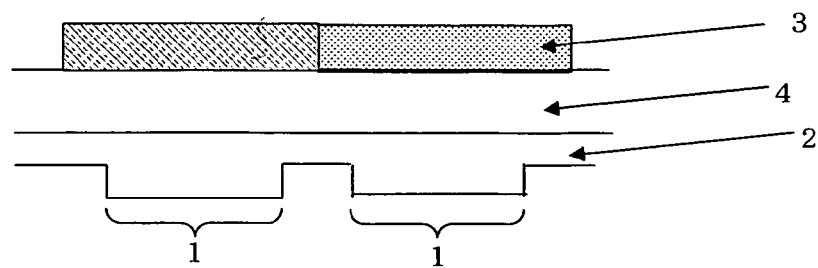
Figure 7B:
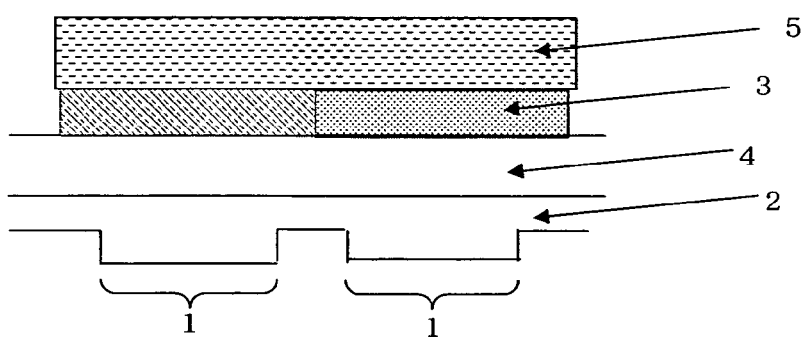
Figure 7B:
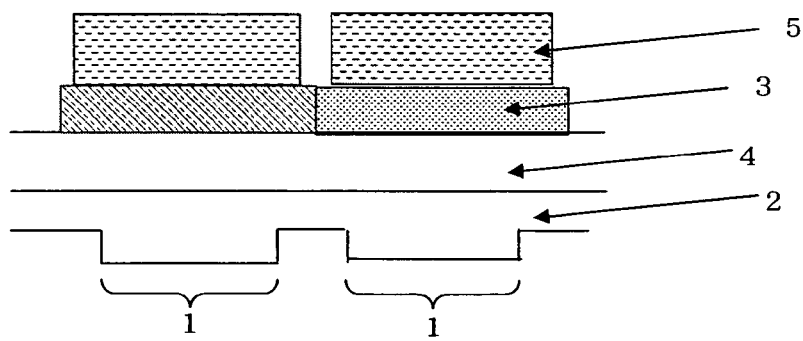
Figure 7C:
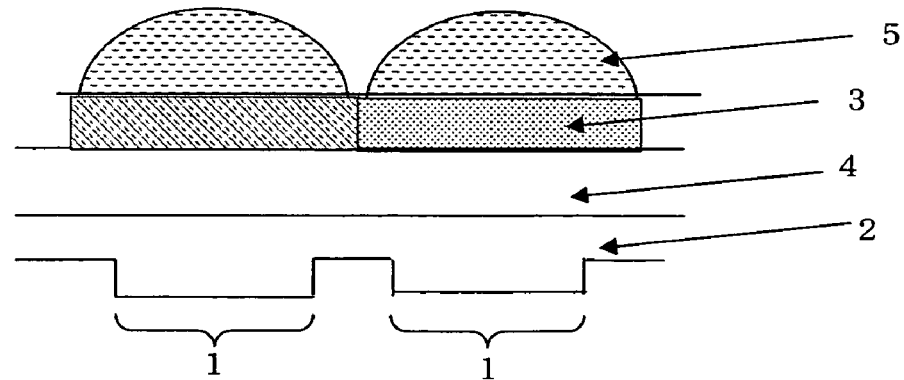
Figure 7C:
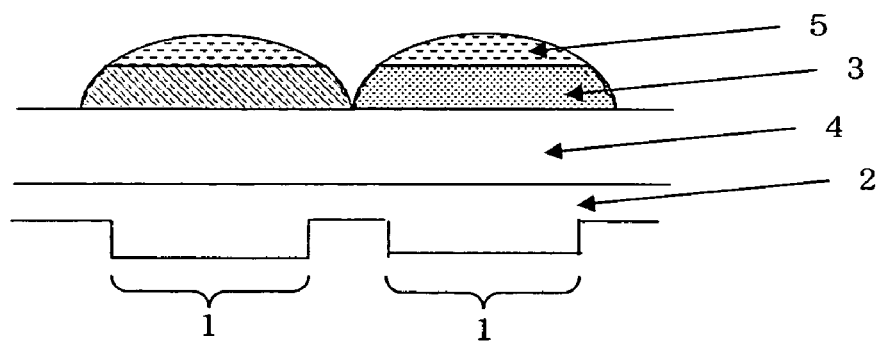
Figure 7C:
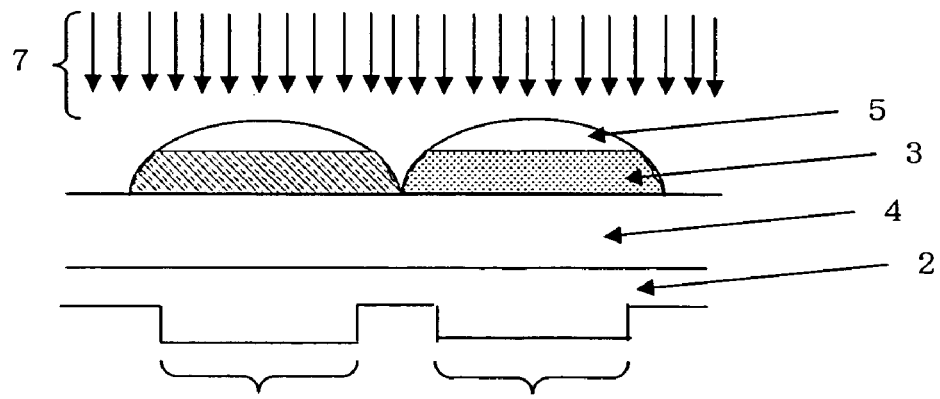

FIGS. 7A to 7C are diagrams for describing a second method of manufacturing the solid-state image sensor shown in FIG. 3. FIGS. 7A to 7C are different from FIGS. 6A to 6C in that the step shown in FIG. 6B(f) and the subsequent steps are replaced by the step shown in FIG. 7B(f) and the subsequent steps. The following description focuses on such difference, with descriptions of the same steps omitted. In the step shown in FIG. 7B(f) and the subsequent steps, microlenses 5, each made up of a transparent layer and a color filter layer, are formed by decolorizing the microlenses 5 by ultraviolet radiation at the last stage.

FIGS. 8A to 8D are diagrams for describing a third method of manufacturing the solid-state image sensor shown in FIG. 3. FIGS. 8A to 8D are different from FIGS. 6A to 6C in that the step shown in FIG. 6C(g) and the subsequent steps are replaced by the step shown in FIG. 8C(g) and the subsequent steps. The following description focuses on such difference, with descriptions of the same steps omitted.

Figure 8A:
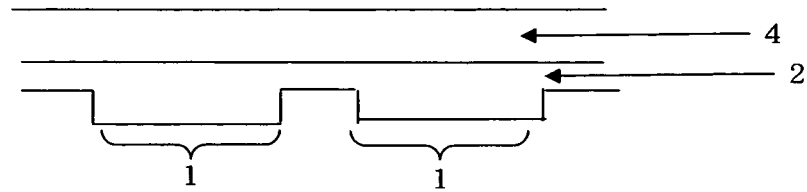
FIG. 8A to FIG. 8D are diagrams, each showing a third method of manufacturing the solid-state image sensor shown in FIG. 3.
Figure 8A:
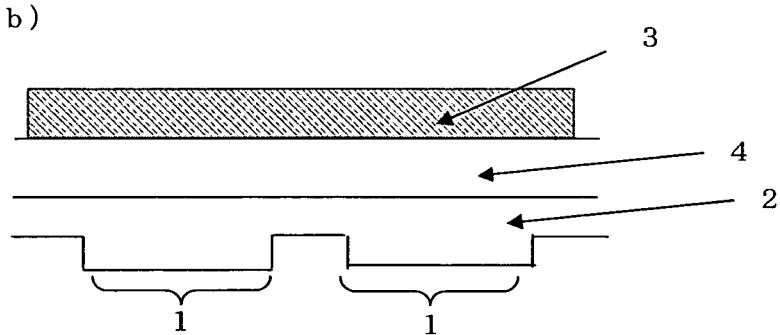
Figure 8A:
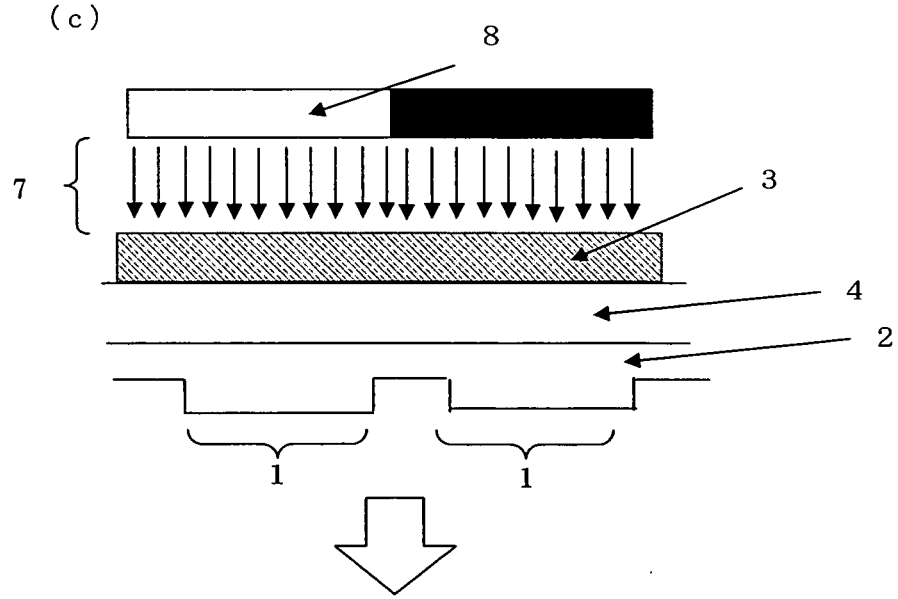
Figure 8A:
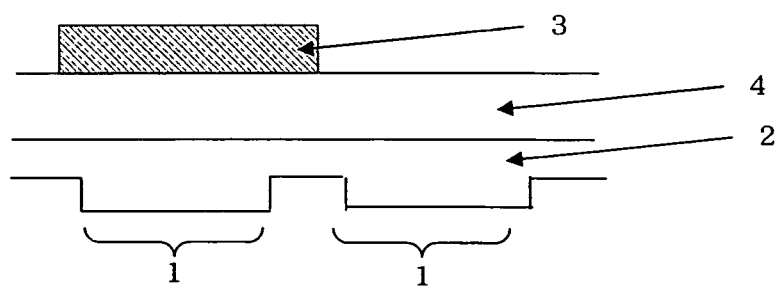
Figure 8B:
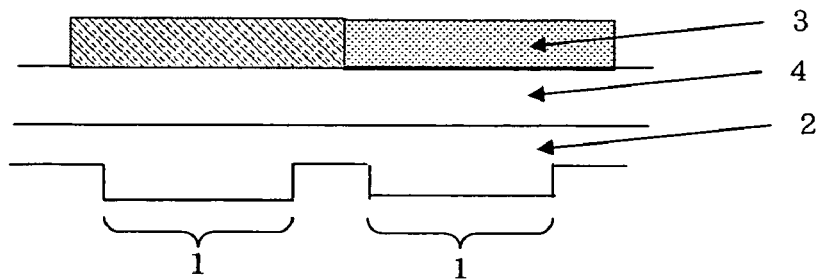
Figure 8B:
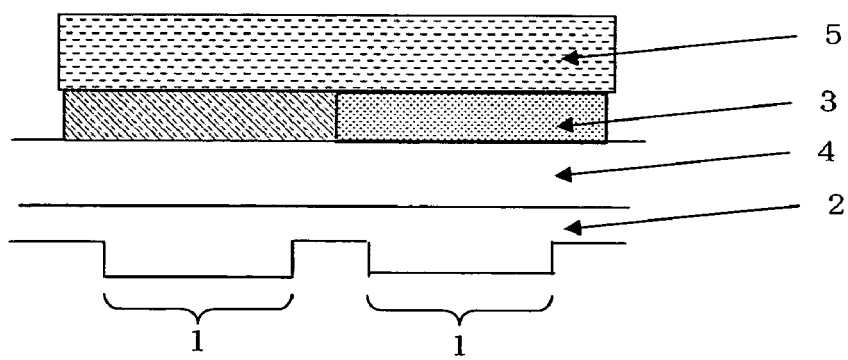
Figure 8B:
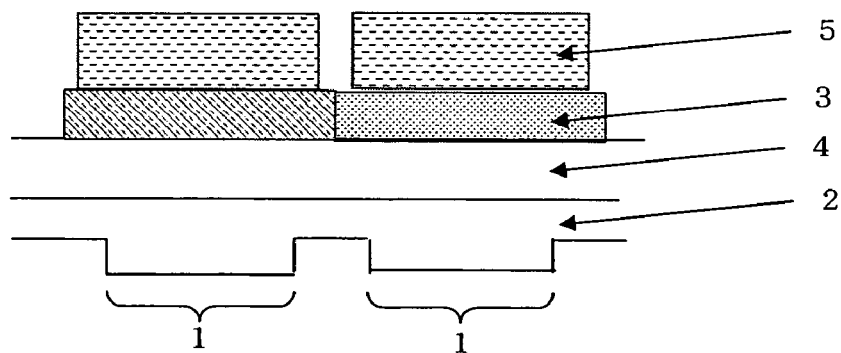
Figure 8C:
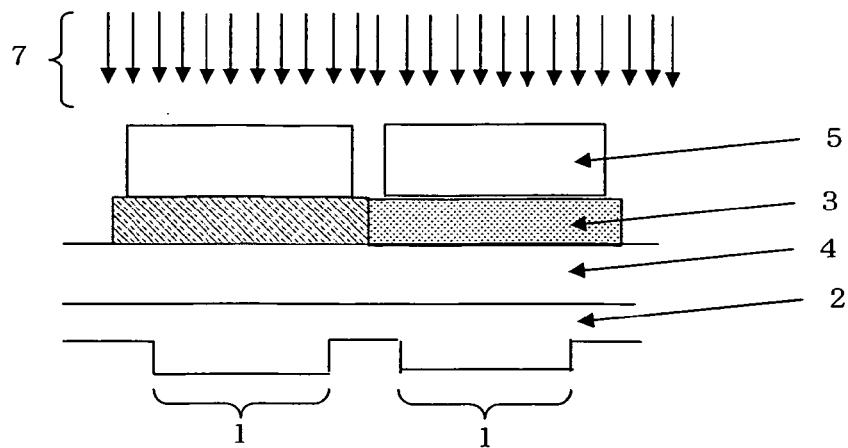
Figure 8C:
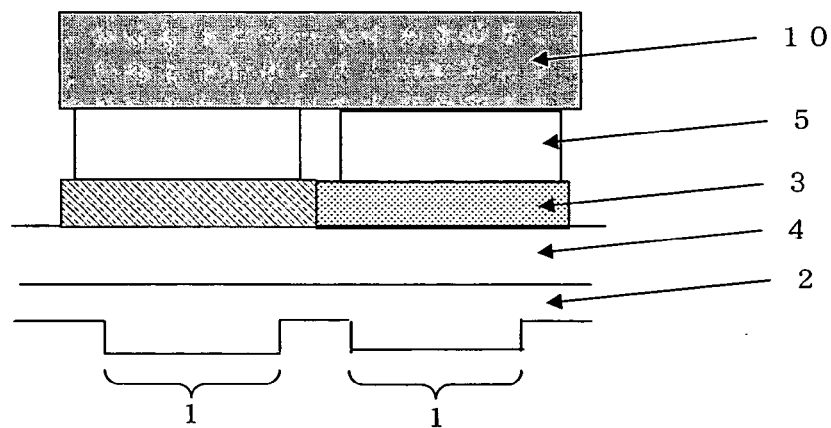
Figure 8C:
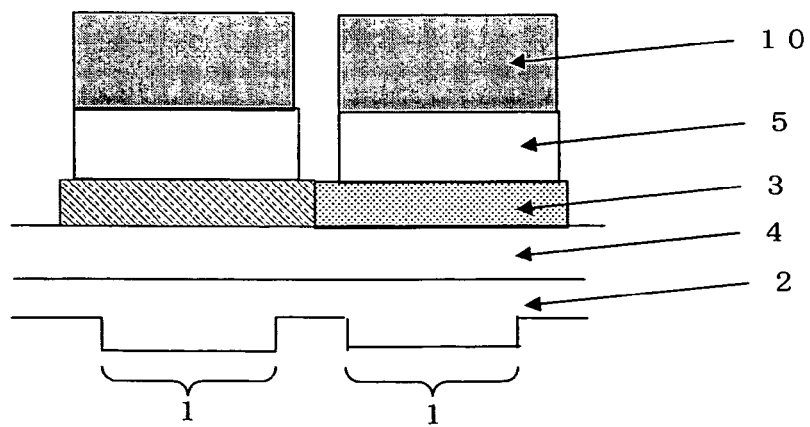
Figure 8D:
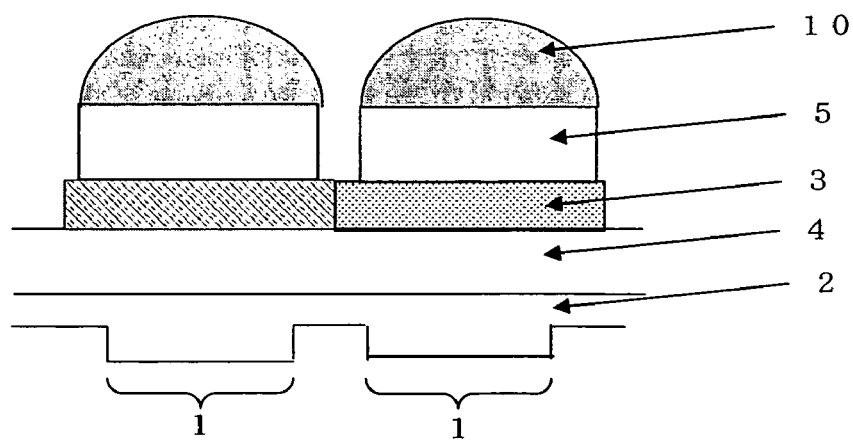
Figure 8D:
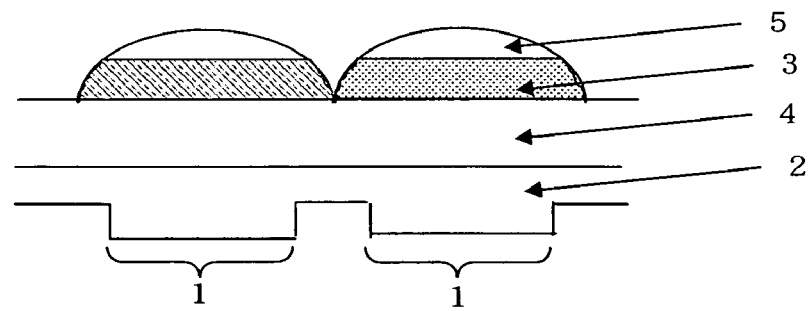
Figure 9A:
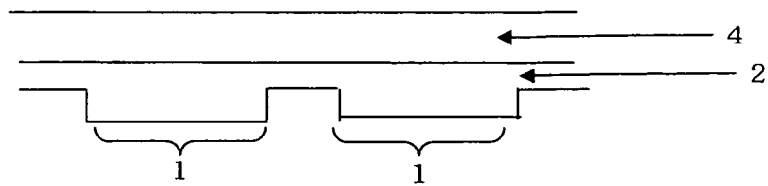
FIG. 9A to FIG. 9D are diagrams, each showing a fourth method of manufacturing the solid-state image sensor shown in FIG. 3.
Figure 9A:
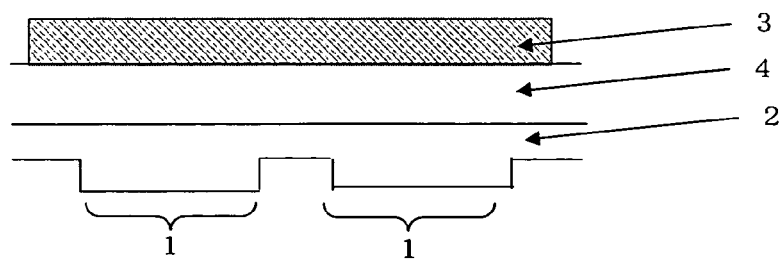
Figure 9A:
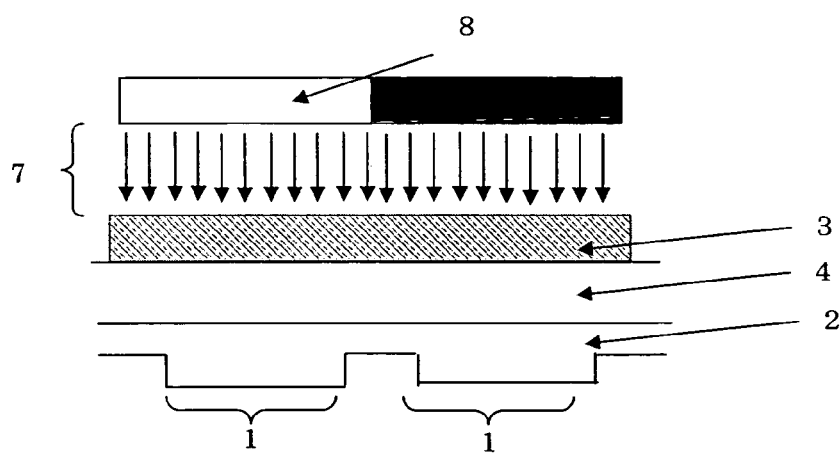
Figure 9A:
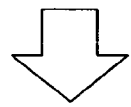
Figure 9A:
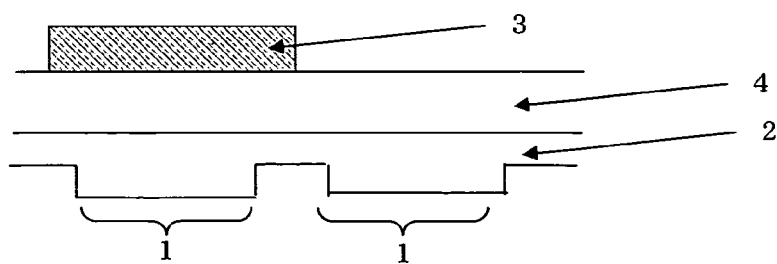
Figure 9B:
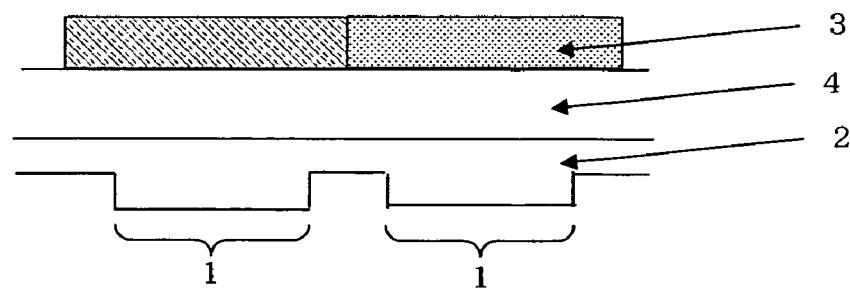
Figure 9B:
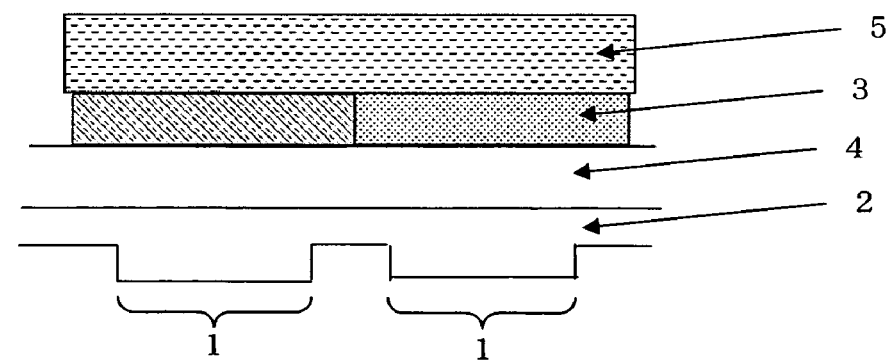
Figure 9B:
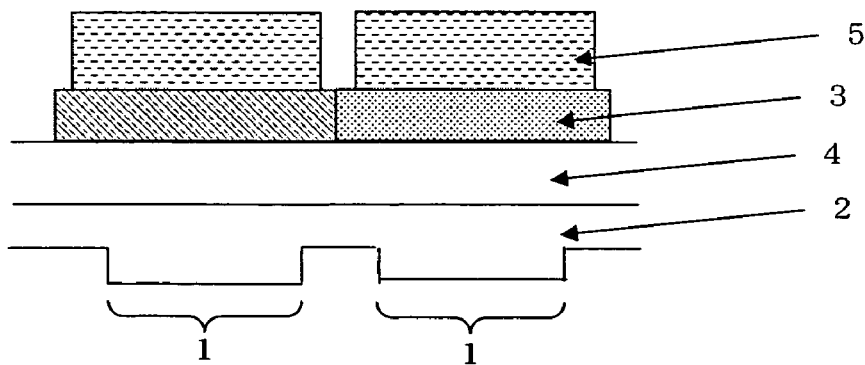
Figure 9C:
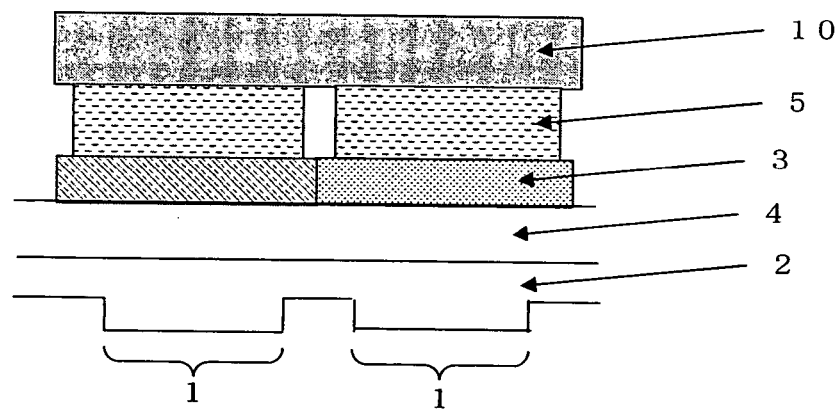
Figure 9C:
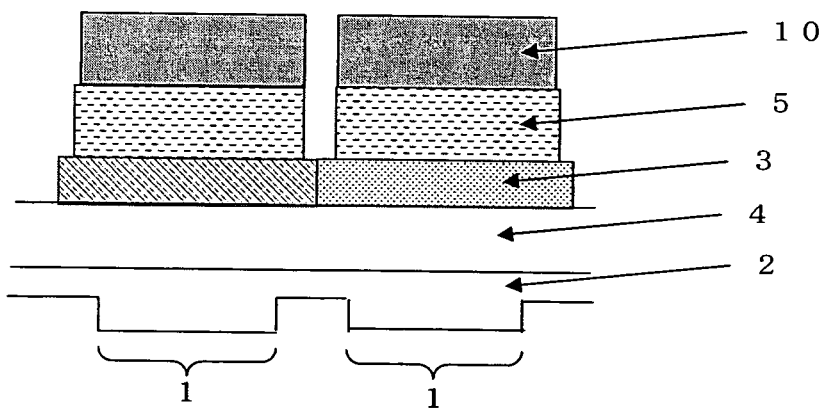
Figure 9C:
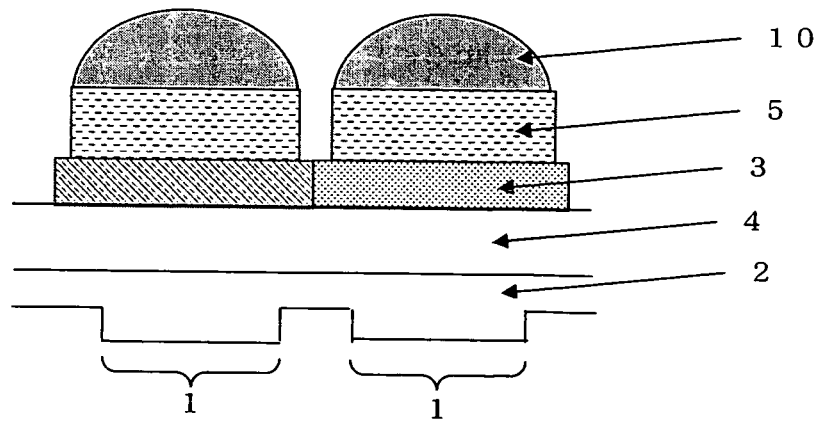
Figure 9D:
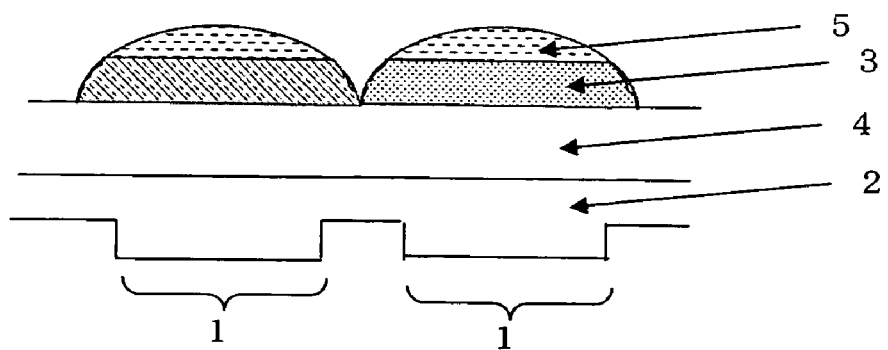
Figure 9D:
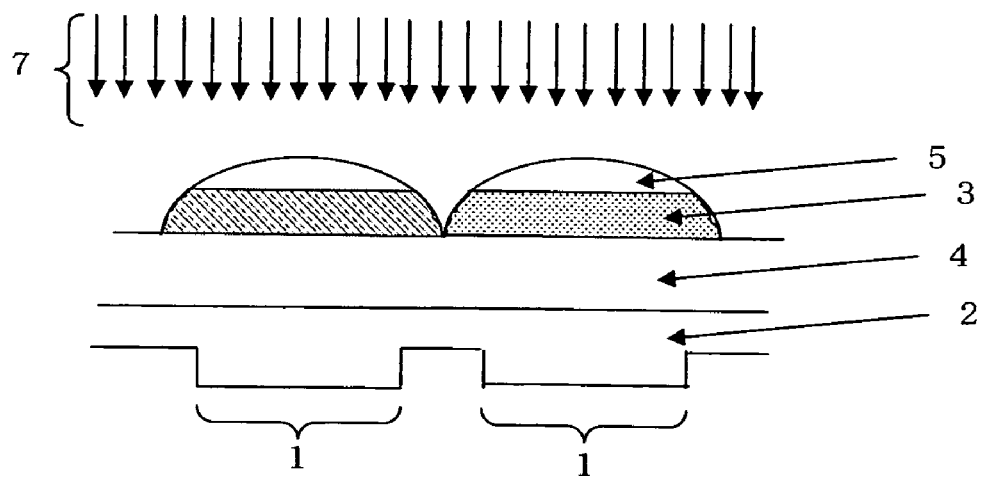

Steps shown in FIGS. 8C(g) to 8D(k) are intended for manufacturing a solid-state image sensor in the case where material used for microlenses 5 does not have thermal flow characteristics. Referring to FIG. 8B(e), a microlens resist 5 is applied on color filters 3, and then referring to FIG. 8B(f), patterned microlens resists 5 are formed using a predetermined mask by performing exposure and development of the microlens resist 5. Then, referring to FIG. 8C(g), the patterned microlens resists 5 are decolorized by ultraviolet radiation. Furthermore, referring to FIG. 8C(h), a microlens shape formation resist 10 having thermal flow characteristics is applied onto the patterned microlens resists 5, and then referring to FIG. 8C(i), patterned microlens shape formation resists 10 are formed using a predetermined mask by performing exposure and development of the microlens shape formation resist 10. Then, referring to FIG. 8D(j), thermal flow processing is performed on the patterned microlens shape formation resists 10 so that the patterned microlens shape formation resists 10 are formed into the shape of microlenses 5. Finally, referring to FIG. 8D(k), microlenses 5 are formed by etching back the patterned color filter resists, microlens resists, and microlens shape formation resists from the above so as to transfer the shape of the microlenses 5.

FIGS. 9A to 9D are diagrams for describing a fourth method of manufacturing the solid-state image sensor shown in FIG. 3. FIGS. 9A to 9D are different from FIGS. 8A to 8D in that the step shown in FIG. 8C(g) and the subsequent steps are replaced by the step shown in FIG. 9C(g) and the subsequent steps. The following description focuses on such difference, with descriptions of the same steps omitted. In the step shown in FIG. 9C(g) and the subsequent steps, microlenses 5, each made up of a transparent layer and a color filter layer, are formed by decolorizing the microlenses 5 by ultraviolet radiation at the last stage.

Figure 10A:
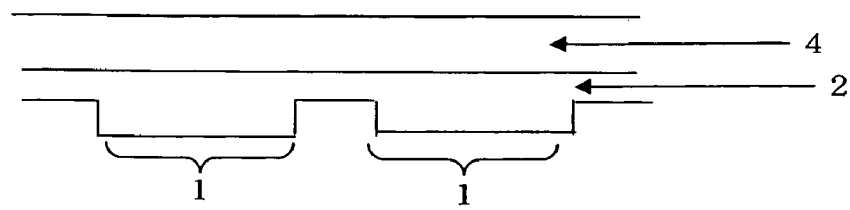
FIG. 10A to FIG. 10C are diagrams, each showing a fifth method of manufacturing the solid-state image sensor shown in FIG. 3.
Figure 10A:
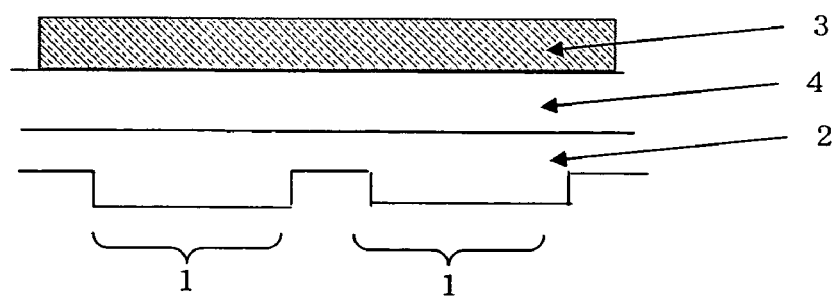
Figure 10A:
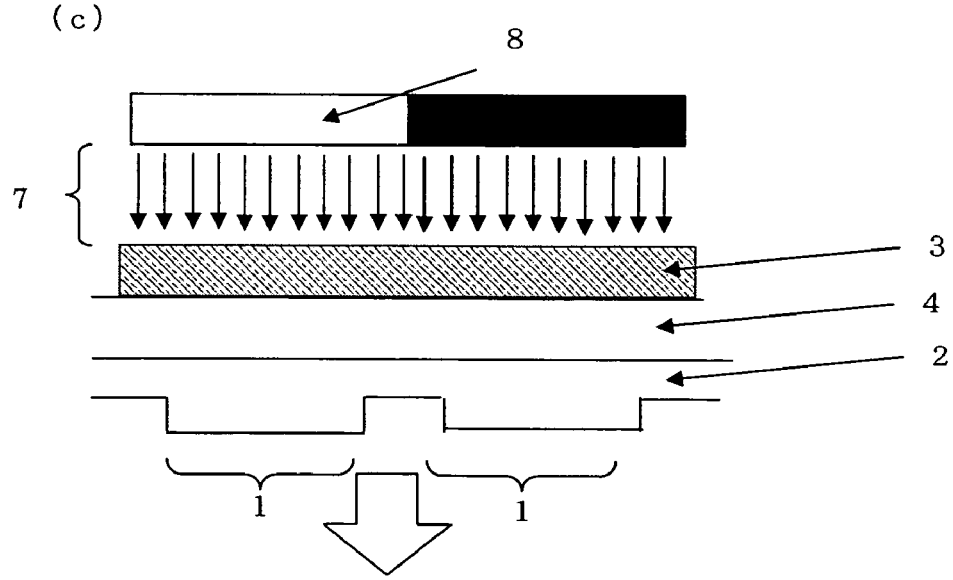
Figure 10A:
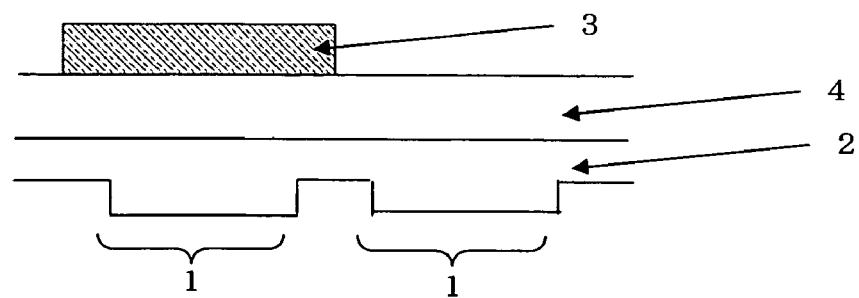
Figure 10B:
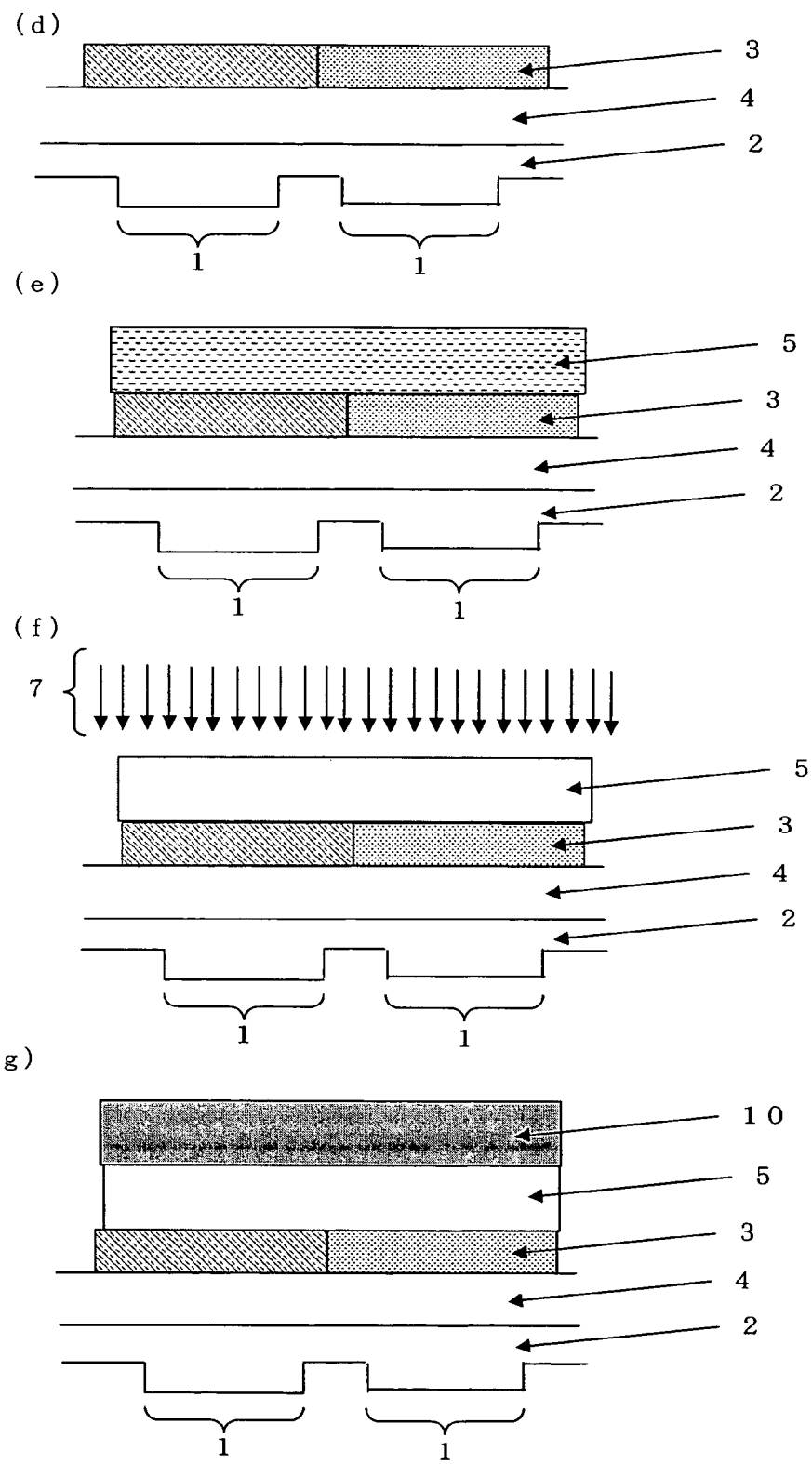
Figure 10C:
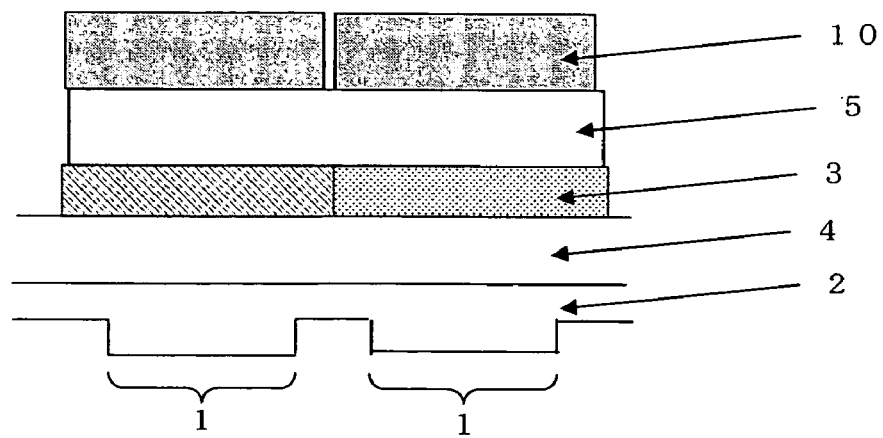
Figure 10C:
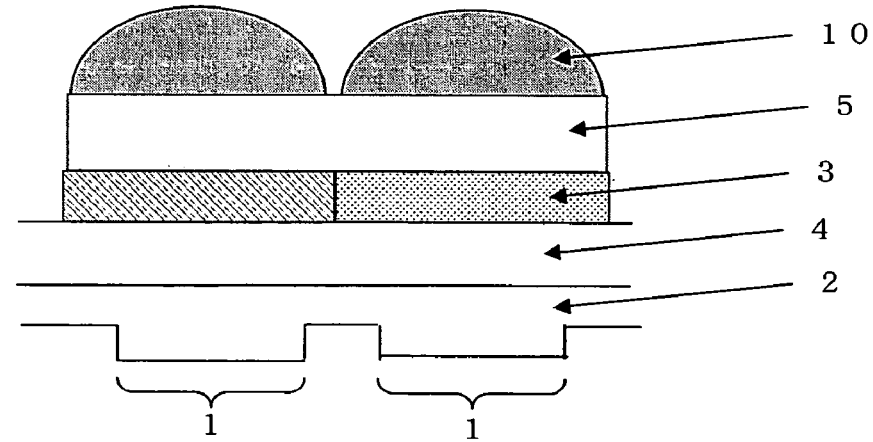
Figure 10C:
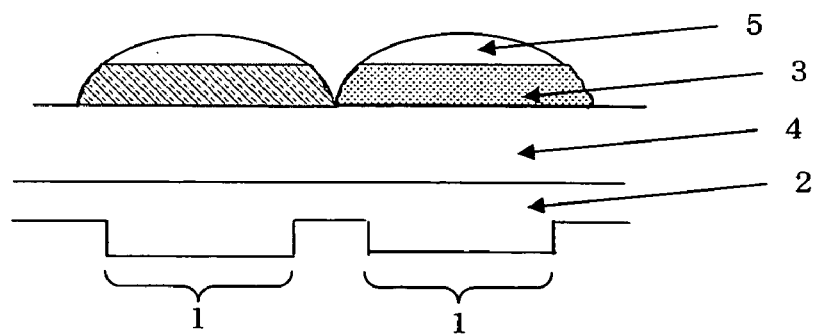

FIGS. 10A to 10C are diagrams for describing a fifth method of manufacturing the solid-state image sensor shown in FIG. 3. FIGS. 10A to 10C are different from FIGS. 8A to 8D in that the step shown in FIG. 8B(f) and the subsequent steps are replaced by the step shown in FIG. 10B(f) and the subsequent steps. The following description focuses on such difference, with descriptions of the same steps omitted.

In the step shown in FIG. 8B(f) and the subsequent steps, microlenses are formed by etching back the shape of microlenses made of a resist having thermal flow characteristics, but as shown in the step shown in FIG. 10B(f) and the subsequent steps, it is also possible to form microlenses without performing exposure and development of a microlens shape formation resist 10 after its application.

Figure 11A:
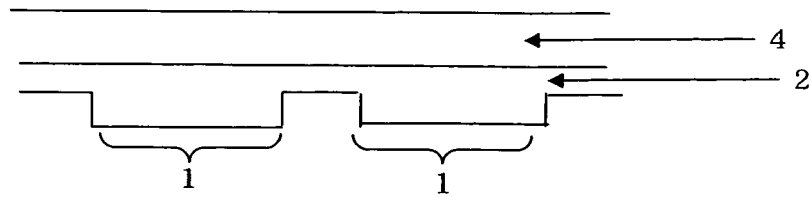
FIG. 11A to FIG. 11C are diagrams, each showing a sixth method of manufacturing the solid-state image sensor shown in FIG. 3.
Figure 11A:
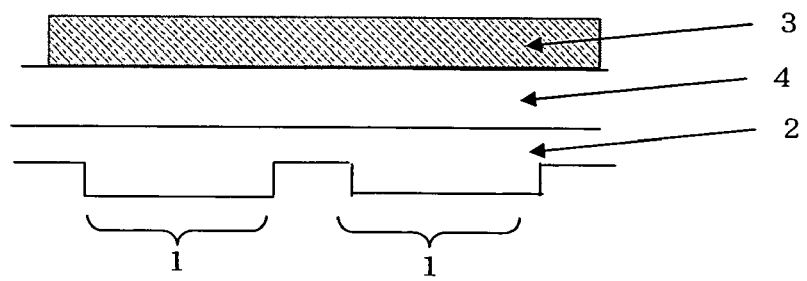
Figure 11A:
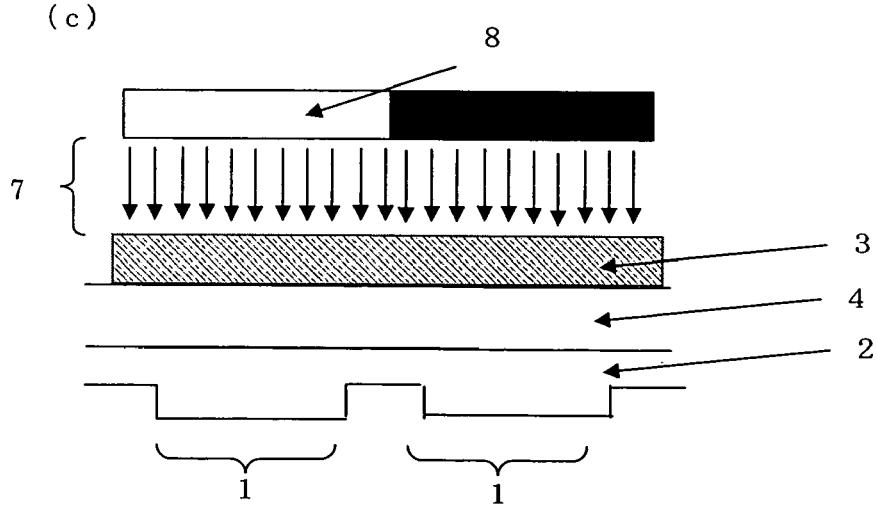
Figure 11A:
Figure 11A:
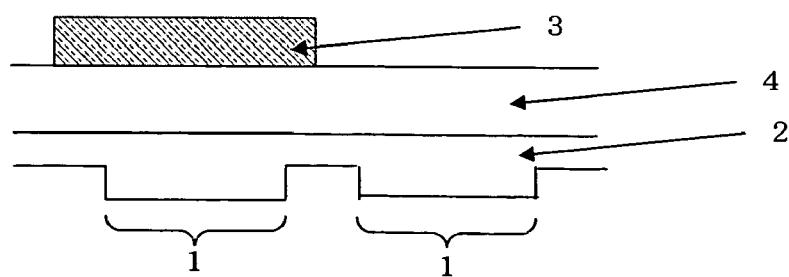
Figure 11B:
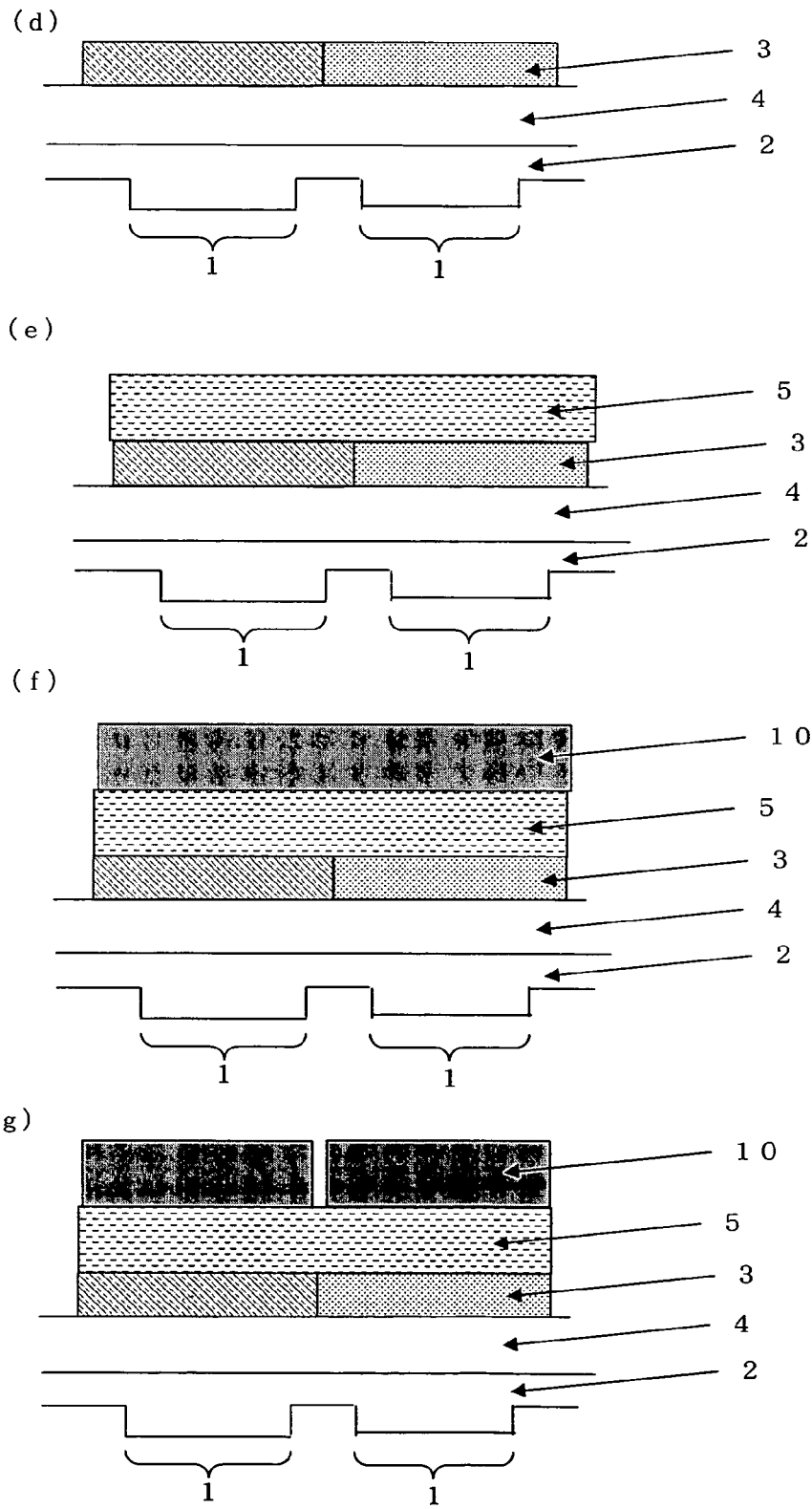
Figure 11C:
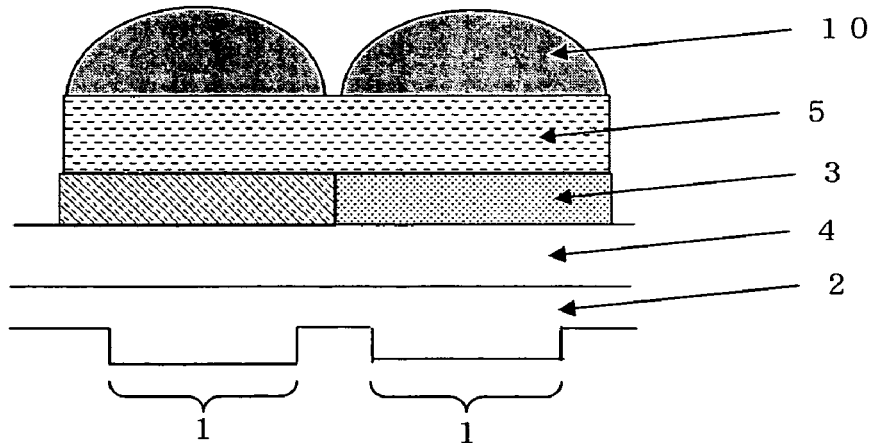
Figure 11C:
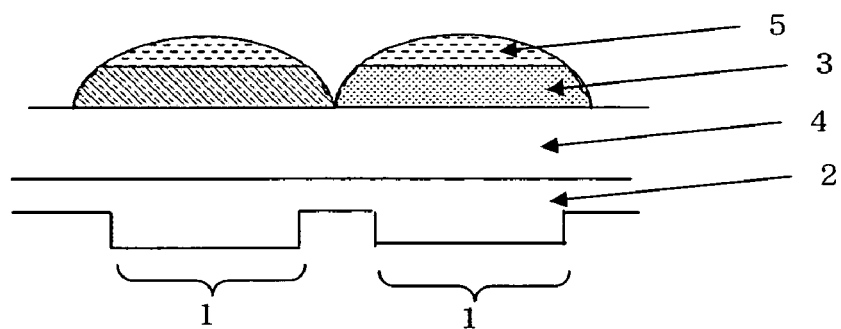
Figure 11C:
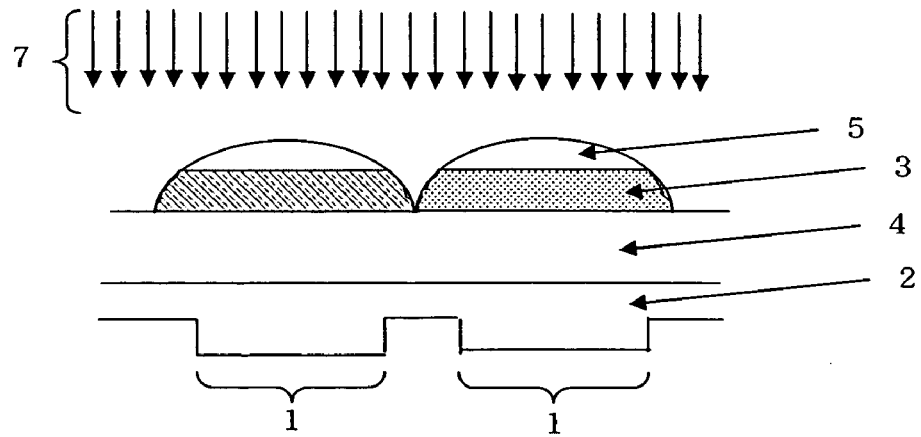

FIGS. 11A to 11C are diagrams for describing a sixth method of manufacturing the solid-state image sensor shown in FIG. 3. FIGS. 11A to 11C are different from FIGS. 10A to 10C in that the step shown in FIG. 10B(f) and the subsequent steps are replaced by the step shown in FIG. 11B(f) and the subsequent steps. The following description focuses on such difference, with descriptions of the same steps omitted. In the step shown in FIG. 11B(f) and the subsequent steps, microlenses 5, each made up of a transparent layer and a color filter layer, are formed by decolorizing the microlenses 5 by ultraviolet radiation at the last stage.

Furthermore, as shown in FIGS. 12A, 12B, 13A, and 13B, it is also possible to form color filters and microlenses by use of gray-tone mask. Here, a description is given of the graytone mask The existing masks have a black and white pattern, which is used for leaving or removing resist. In contrast, the gray-tone mask is used for leaving or removing resist to the middle by use of a gray pattern. With the use of such gray-tone mask, the thickness of the film to be eventually formed can be adjusted. That is to say, it is possible to leave a part of the resist where a film should be formed, but resist is not "completely removed or left". For example, in the case of forming microlenses using a general existing mask, a resist is applied first, then patterning of the resist is performed using the mask such that a rectangular shape is formed, and the formation of the microlenses is completed after thermal flow processing is performed. However, in the case of using the gray-tone mask whose mask pattern is a gray pattern, a lens shape can be obtained after the exposure and development of resist, by using a gray pattern mask with which the film with required thickness remains.

Figure 12A:
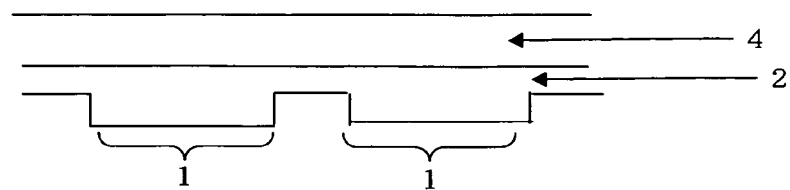
FIG. 12A and FIG. 12B are diagrams, each showing a seventh method of manufacturing the solid-state image sensor shown in FIG. 3.
Figure 12A:
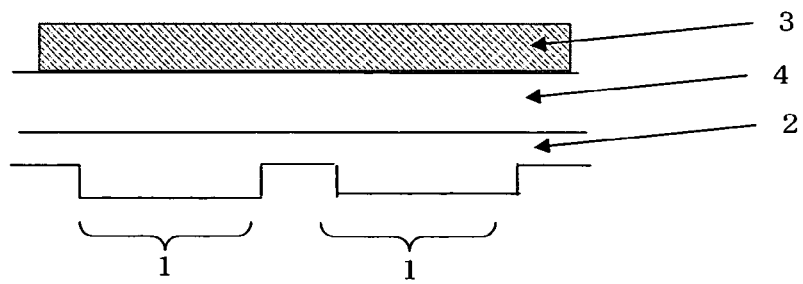
Figure 12A:
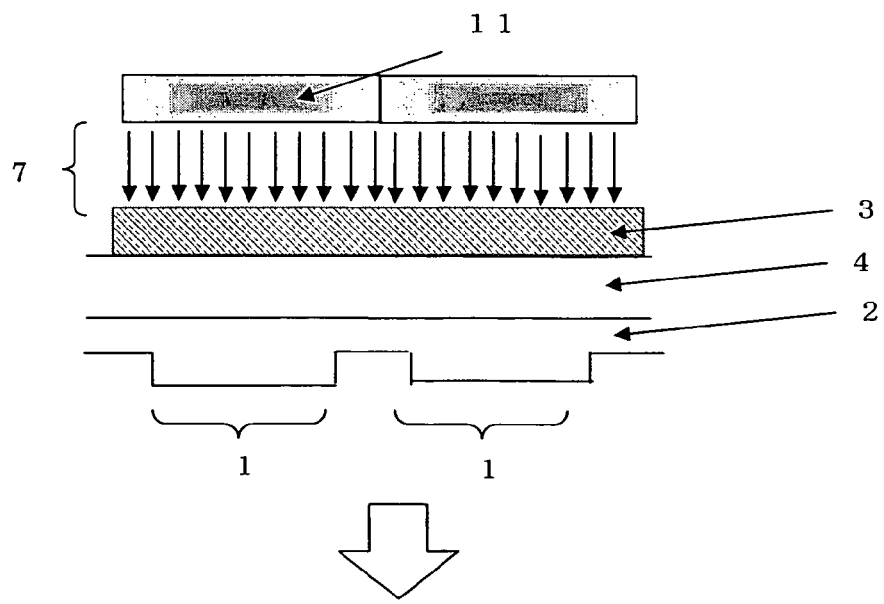
Figure 12A:
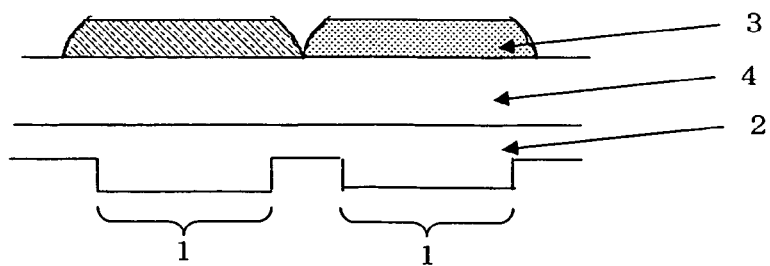
Figure 12B:
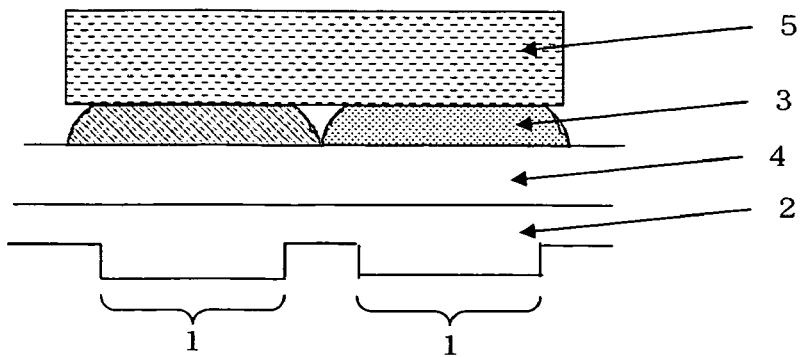
Figure 12B:
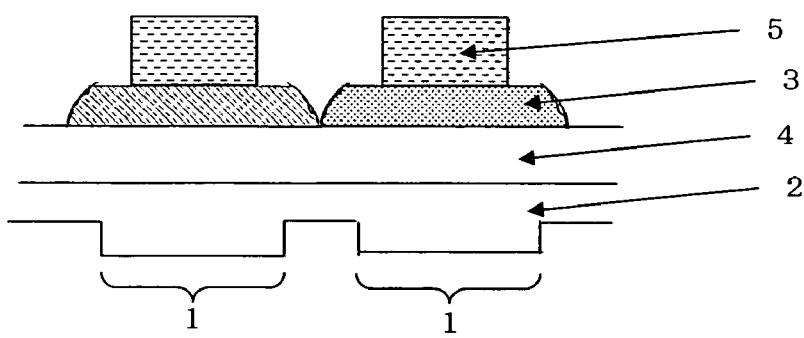
Figure 12B:
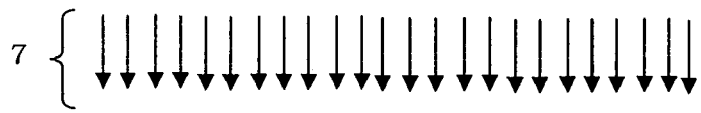
Figure 12B:
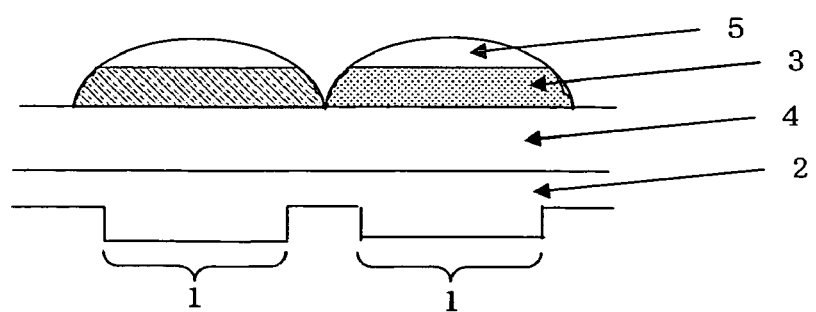

FIGS. 12A and 12B are diagrams showing a seventh method of manufacturing the solid-state image sensor shown in FIG. 3.

Referring to FIG. 12A(a), a film 2 made of BPSG or the like is formed on the surface of photodiodes 1, and then a transparent film 4 made of acryl or the like is formed on the surface of the film 2 such that the thickness of the transparent film 4 ranges from 0.1 to 10μm depending on need. Referring to FIG 12A(b), a color filter resist is applied onto the transparent film 4, and then referring to FIG. 12A(c), color filters 3, each forming the bottom part of the corresponding microlens 5, are formed using a predetermined mask. When this is done, the color filters 3 are formed such that their thickness ranges from a quarter to two-thirds of the finishing height of the corresponding microlenses 5. Then, the same application, development, and exposure of a color filter resist as described above are carried out for color filters 3 of the respective colors, so as to form a color filter layer.

Furthermore, referring to FIG. 12B(d), a microlens resist is applied on the color filters 3, and referring to FIG. 12B(e), patterned microlens resists 5 are formed using a predetermined mask by performing exposure and development on the microlens resist. Furthermore, referring to FIG. 12B(f), the patterned microlens resists 5 are decolorized by ultraviolet radiation, and referring to FIG. 12B(g), the patterned microlens resists 5 are formed into the shape of microlenses 5 by performing thermal flow processing. Note that, as shown in FIGS. 13A to 13C, the decolorization of the microlenses 5 may be performed at the last stage.

Figure 13A:
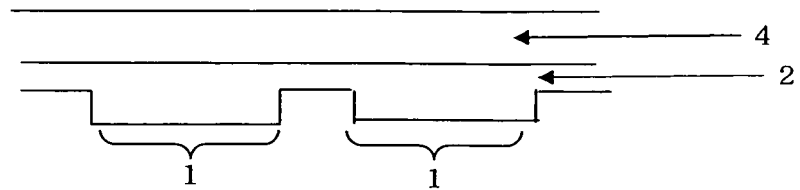
FIG. 13A to FIG. 13C are diagrams, each showing a first method of manufacturing the solid-state image sensor shown in FIG. 4.
Figure 13A:
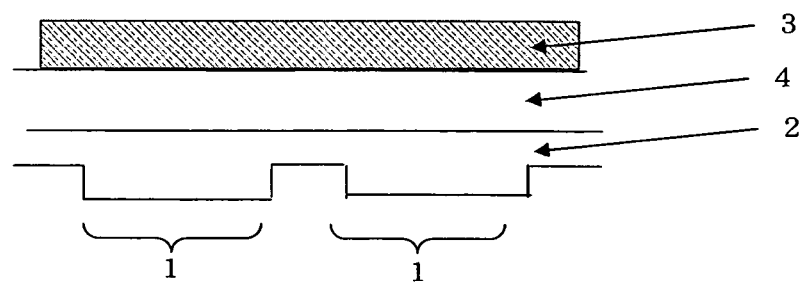
Figure 13A:
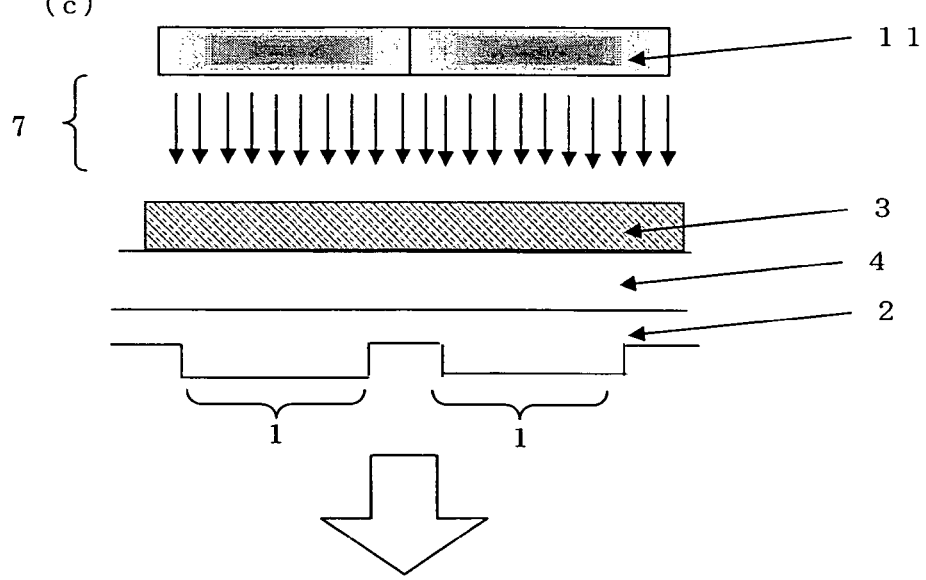
Figure 13A:
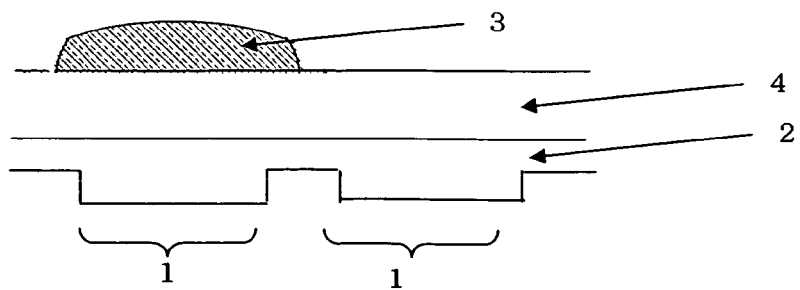
Figure 13B:
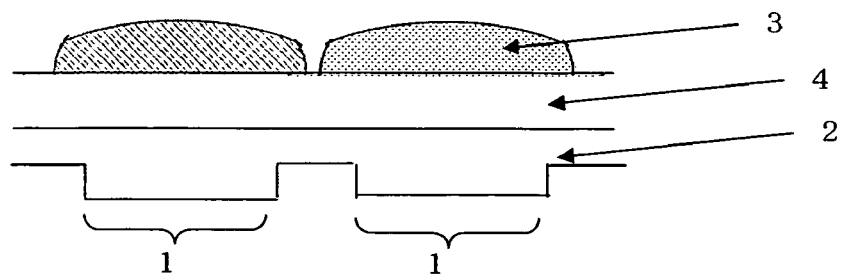
Figure 13B:
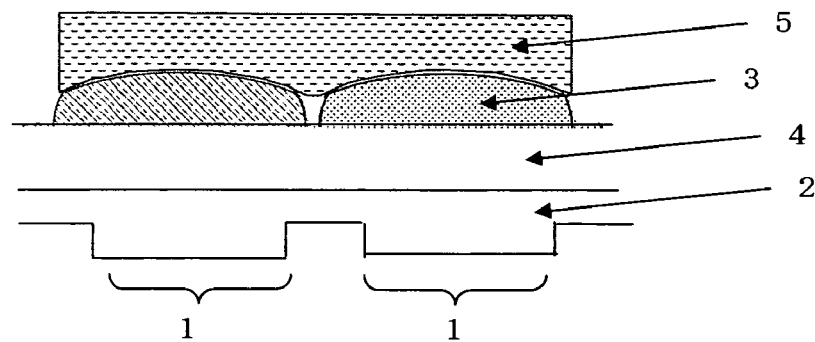
Figure 13C:
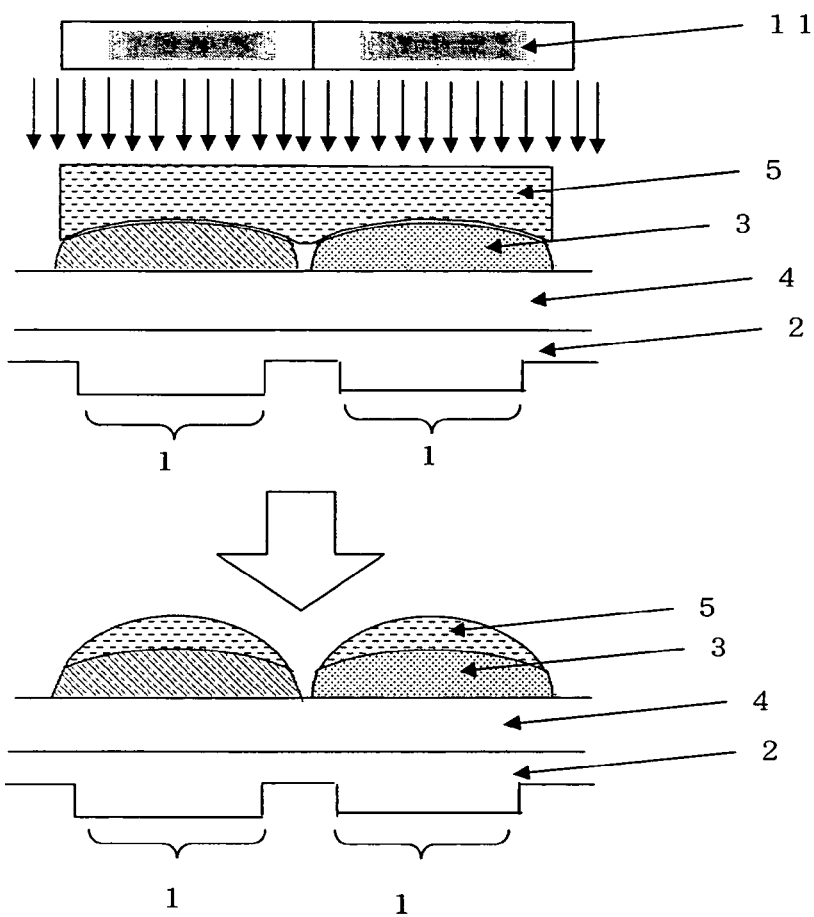
Figure 13C:
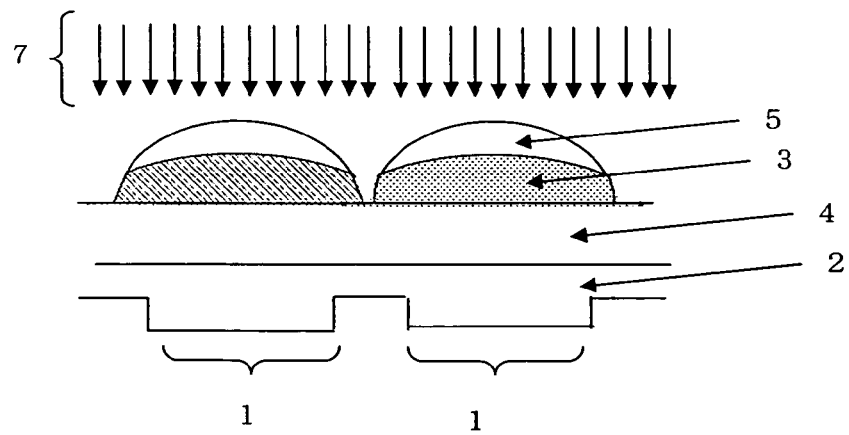

FIGS. 13A to 13C are diagrams for describing a first method of manufacturing the solid-state image sensor shown in FIG. 4. FIGS. 13A to 13C are different from FIGS. 12A to 13C in that the step shown in FIG. 12A(c) and the subsequent steps are replaced by the step shown in FIG. 13A(c) and the subsequent steps. The following description focuses on such difference, with descriptions of the same steps omitted.

The use of the gray-tone mask 11 allows a flexible adjustment of a cross-sectional shape of color filters. In the case of forming color filters 3 as the bottom parts of the respective microlenses such that the thickness of each of the color filters 3 is greater in the cell center and less in the cell periphery, the color filters 3 are formed through the following steps: referring to FIG. 13A(b), a color filter resist is applied onto the transparent film 4 such that its thickness ranges from a quarter to two-thirds of the height of the microlenses 5 (the thickness of each cell center); referring to FIG. 13A(c), exposure and development of the color filters 3 is performed using a pattern of the gray-tone mask 11 that is different from the one shown in FIG. 12A(c); referring to FIG. 13B(d), the same application, development, and exposure of a color filter resist as described above are carried out for color filters 3 of the respective colors, so as to form a color filter layer; referring to FIG. 13B(e), a microlens resist is applied on the respective color filters 3; referring to FIG. 13C(f), exposure and development of the microlens resist is performed using the graytone mask 11; and referring to FIG. 13C(g), decolorization of the microlenses 5 is performed by ultraviolet radiation.

Figure 14A:
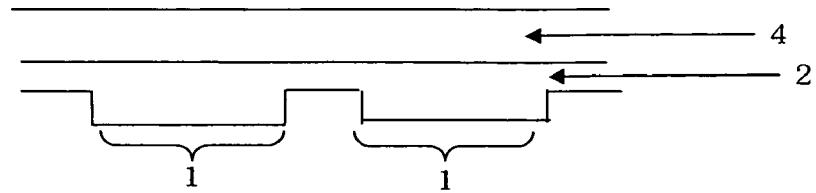
FIG. 14A to FIG. 14C are diagrams, each showing a first method of manufacturing the solid-state image sensor shown in FIG. 5.
Figure 14A:
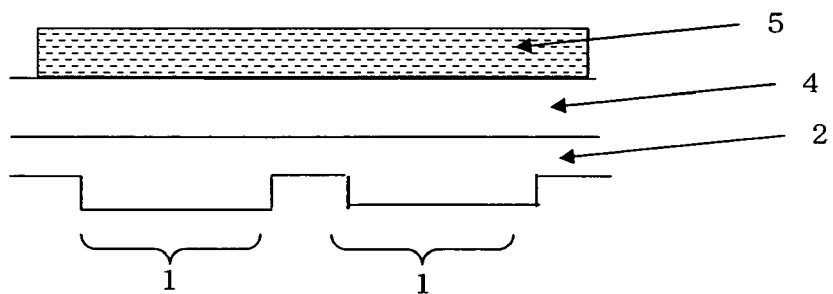
Figure 14A:
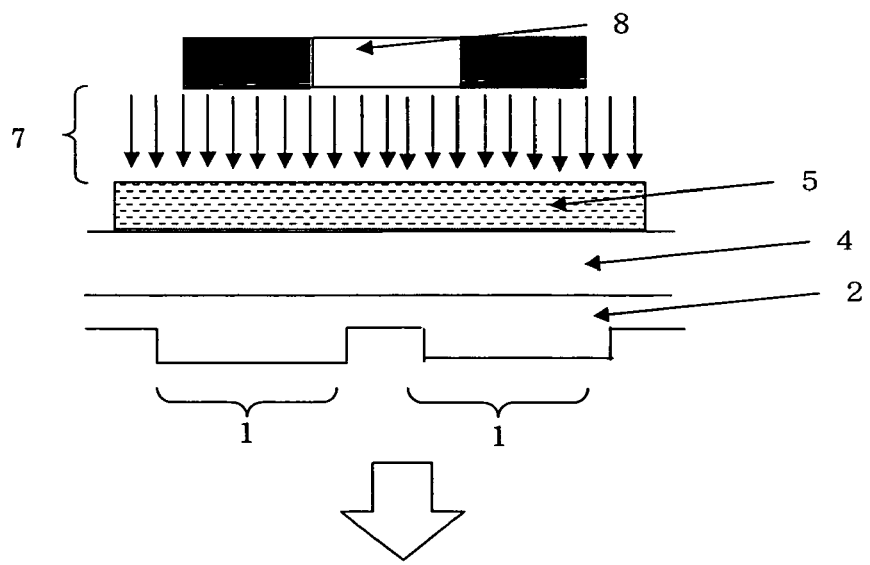
Figure 14A:
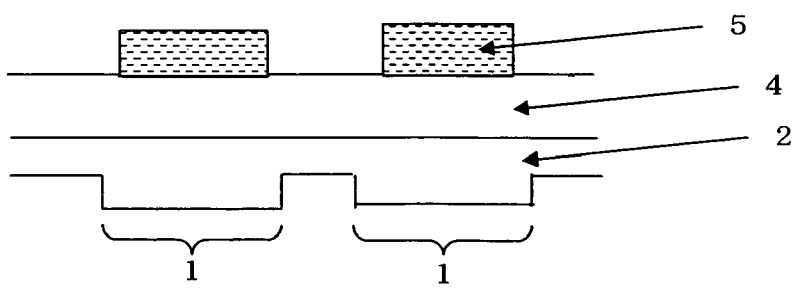
Figure 14B:
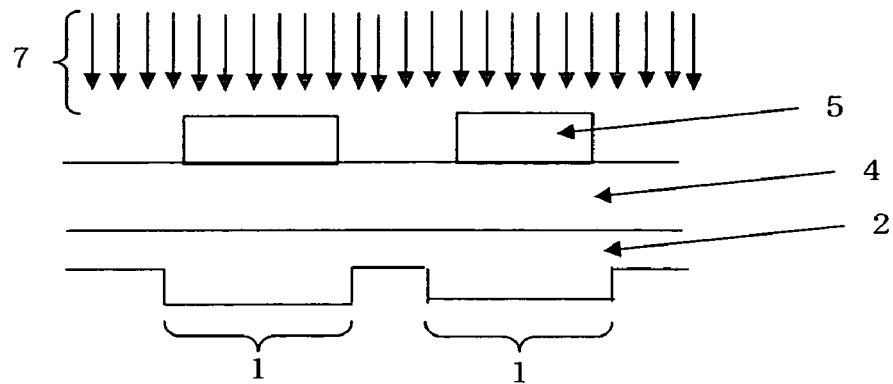
Figure 14B:
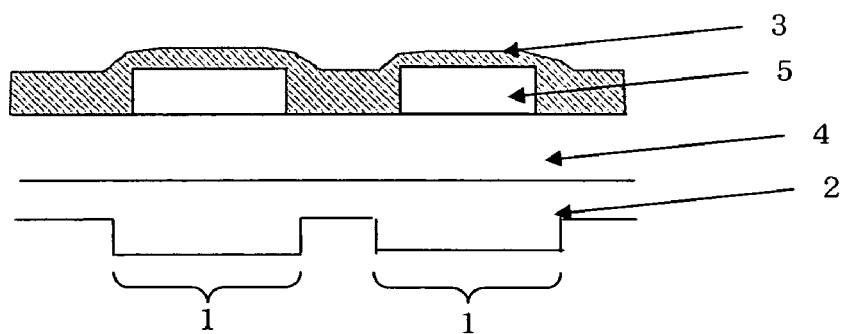
Figure 14B:
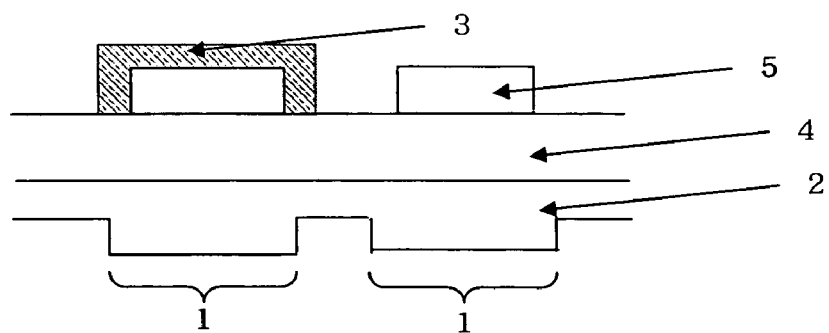
Figure 14C:
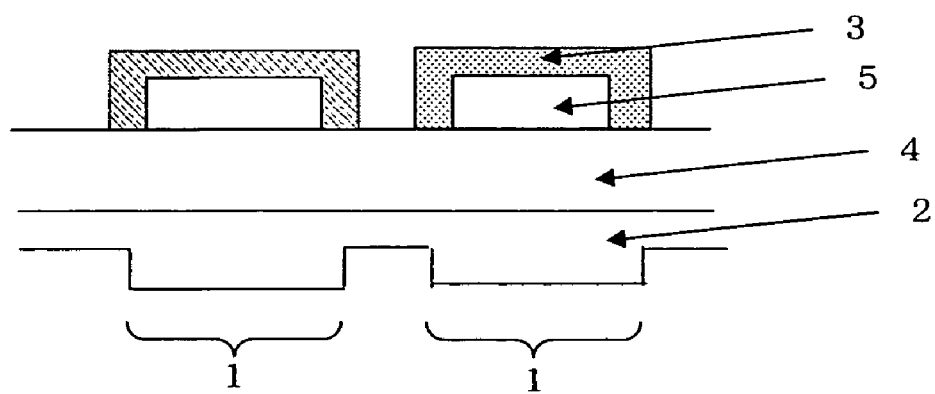
Figure 14C:
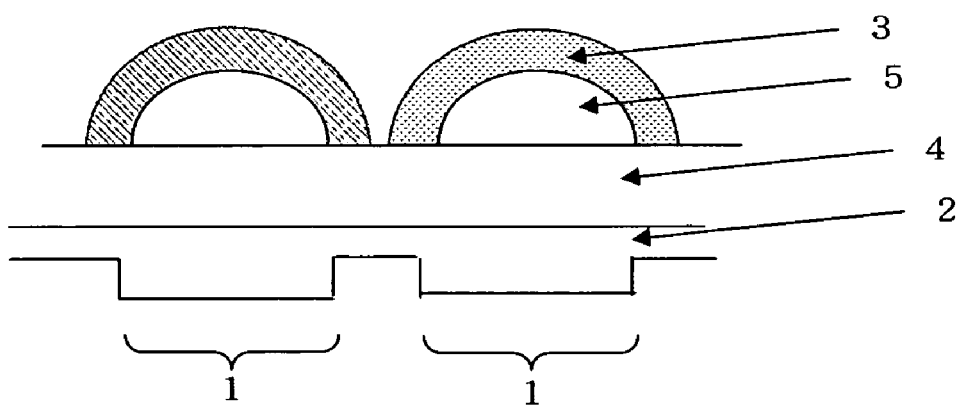

FIGS. 14A to 14C are diagrams for describing a first method of manufacturing the solid-state image sensor shown in FIG. 5.

As shown in FIG. 5, in the case of covering microlenses with color filters, microlenses are formed through, for example, the steps described below. Note that resists used for microlenses 5 and color filters 3 have thermal characteristics, respectively. Referring to FIG. 14A(b), a microlens resist is applied; referring to FIG. 14A(c), exposure and development of the microlens resist is performed so as to perform patterning of the microlens resist; referring to FIG. 14B(e), decolorization of the patterned microlens resists is carried out by ultraviolet radiation; referring to FIG. 14B(e), a color filter resist having thermal flow characteristics is applied onto the decolorized patterned microlens resists; referring to FIG. 14B (f), the same application, development, and exposure of the color filter resist as described above are carried out for color filters 3 of the respective colors; referring to FIG. 14C(g), exposure and development of the color filter resist is performed such that the color filters 3 remain over the top and side surfaces of the corresponding patterned microlens resists; and referring to FIG. 14C(h), thermal flow processing is performed on the microlenses 5 and the color filters 3 at the same time. Note that as shown in FIGS. 15A to 15D, the decolorization of the microlenses 5 by ultraviolet radiation may be performed during a period after when patterned color filter resists 3 and patterned microlens resists 5 are formed and before when thermal flow processing is performed.

FIGS. 15A to 15D are diagrams for describing a second method of manufacturing the solid-state image sensor shown in FIG. 5. FIGS. 15A to 15D are different from FIGS. 14A to 14C in that the step shown in FIG. 14B(e) and the subsequent steps are replaced by the step shown in FIG. 15B(e) and the subsequent steps. The following description focuses on such difference, with descriptions of the same steps omitted.

Figure 15A:
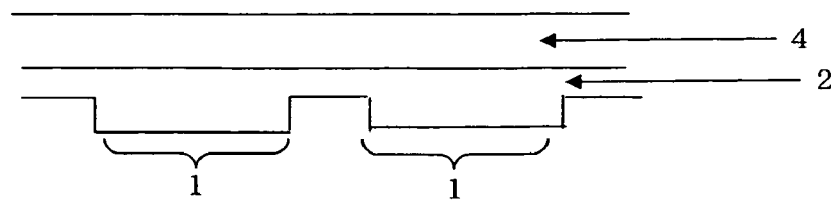
FIG. 15A to FIG. 15D are diagrams, each showing a second method of manufacturing the solid-state image sensor shown in FIG. 5.
Figure 15A:
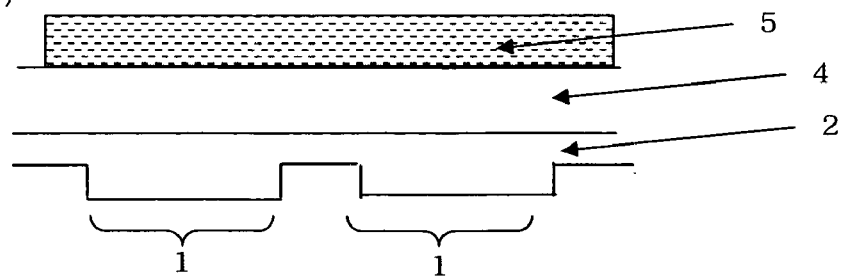
Figure 15A:
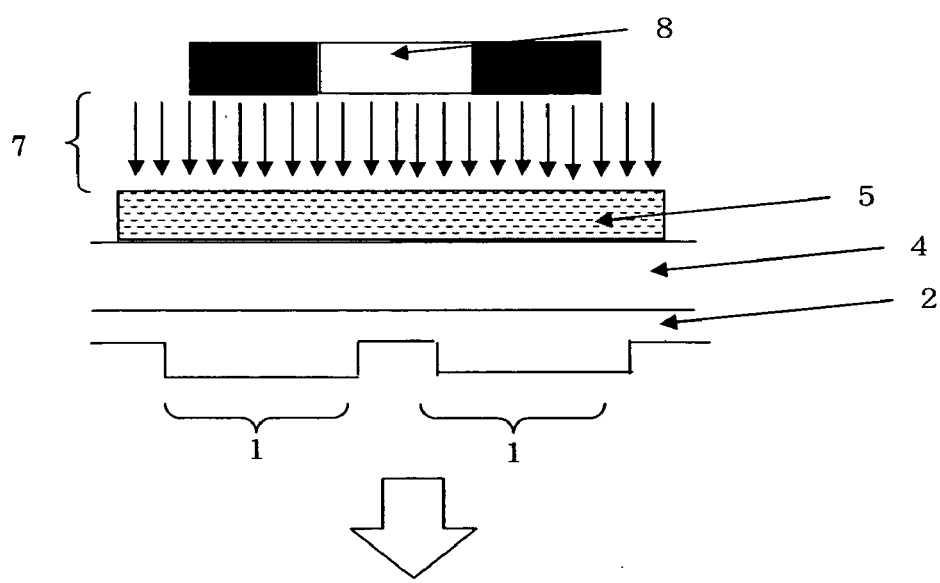
Figure 15A:
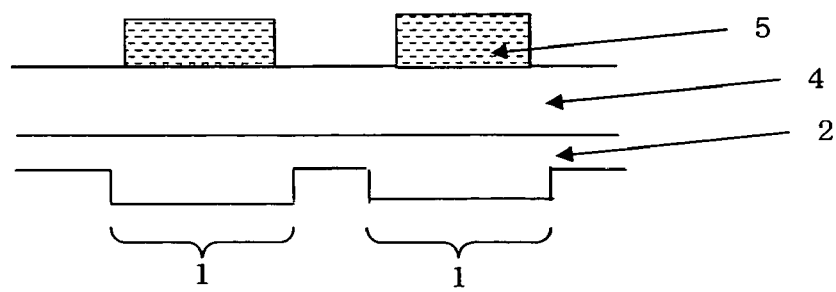
Figure 15B:
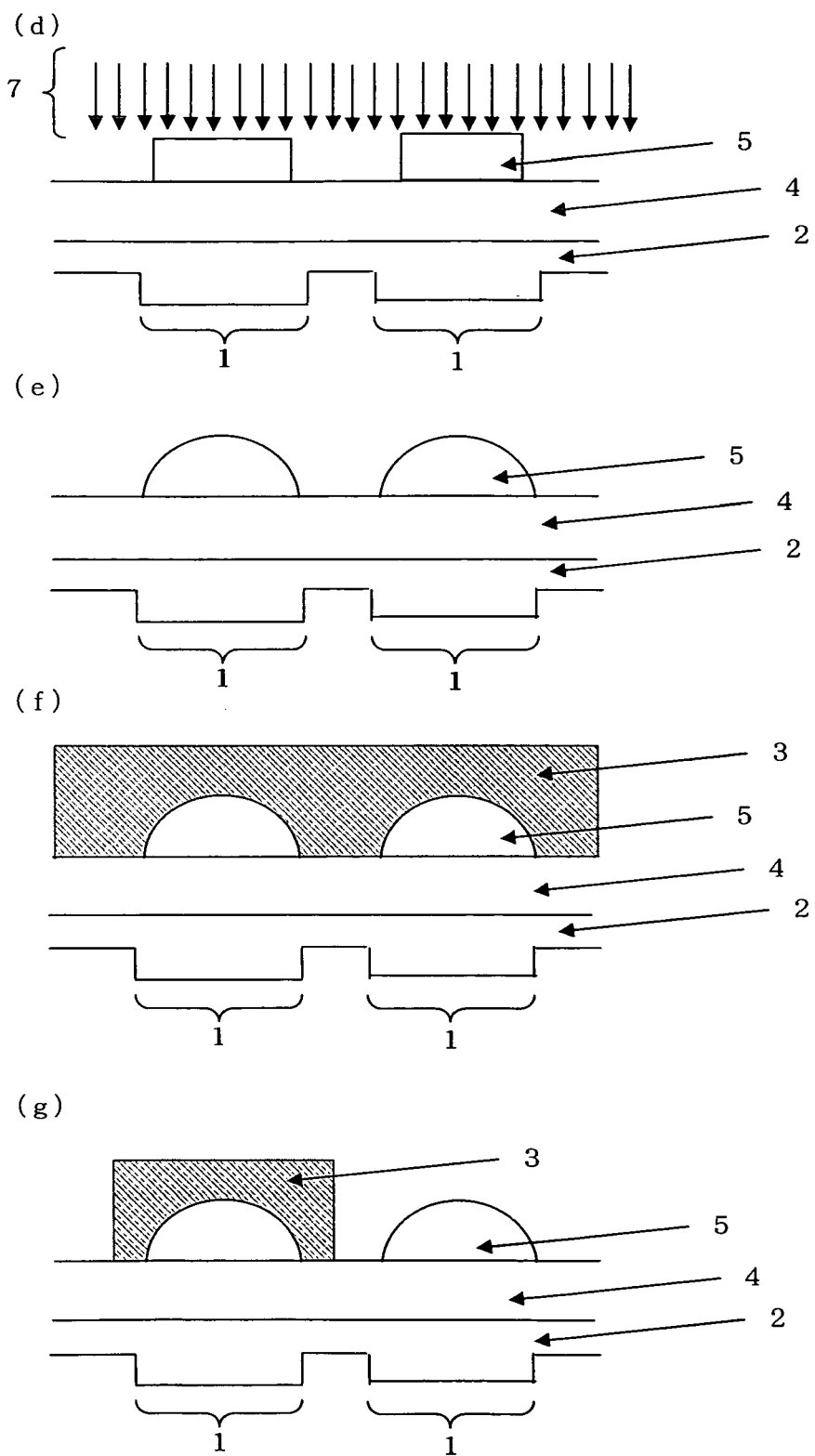
Figure 15C:
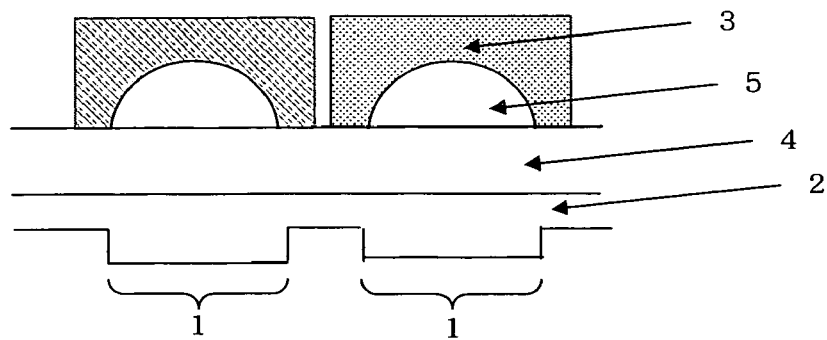
Figure 15C:
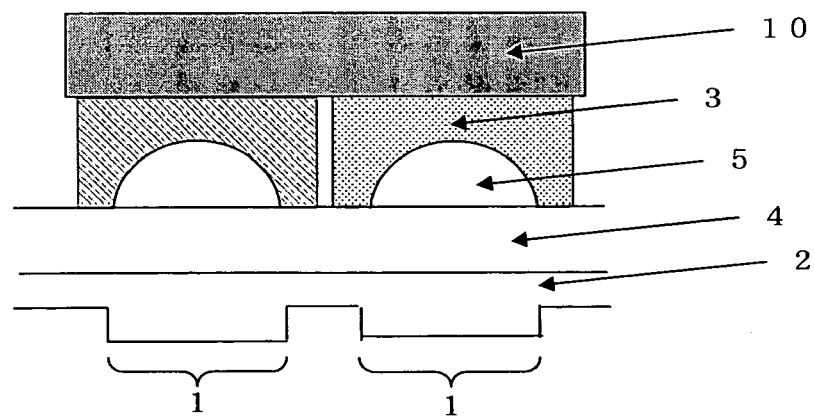
Figure 15C:
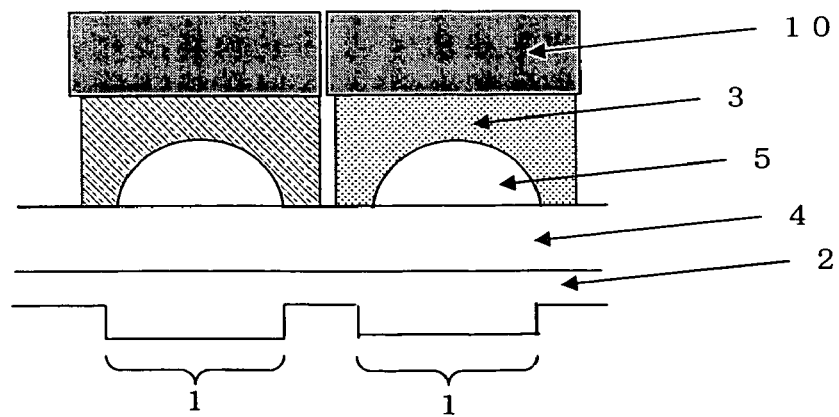
Figure 15D:
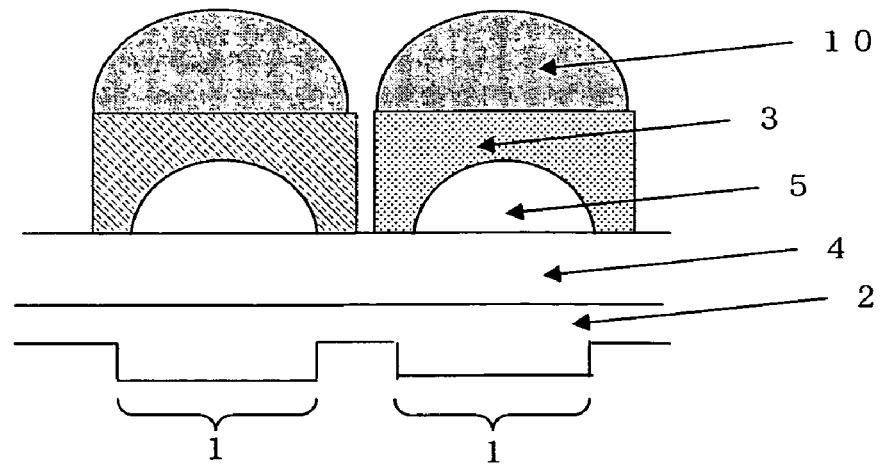
Figure 15D:
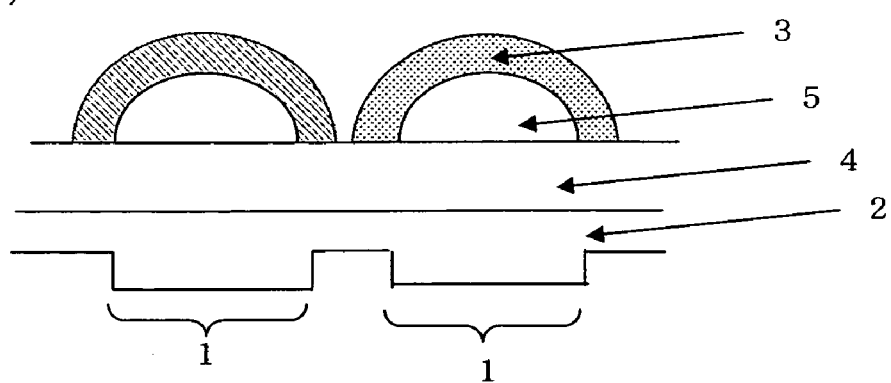

In the case where color filters 3 do not have thermal flow characteristics, as shown in the step shown in FIG. 15A and the subsequent steps, it is possible to form microlenses through the following steps: referring to FIG. 15A(b), a microlens resist is applied onto the transparent film 4; referring to FIG. 15A(c), patterning of the microlens resist is performed through exposure and development of the microlens resist; referring to FIG. 15B(d), decolorization of the patterned microlens resists 5 is performed by ultraviolet radiation; referring to FIG. 15B(e), a small microlens shape is formed by performing thermal flow processing on the patterned microlens resists 5; referring to FIG. 15B(f), a color filter resist is applied onto the transparent film 4 and the patterned microlens resists 5; referring to FIG. 15B(g), patterned color filter resists 3 are formed through exposure and development of the color filter resist; referring to FIG. 15C(h), the same application, development, and exposure of a color filter resist as described above are carried out for color filters 3 of the respective colors, so as to form color filters 3; referring to FIG. 15C(i), a resist having thermal flow characteristics is applied on the color filters 3; referring to FIG. 15C(j), patterned resists 10 are formed by performing exposure and development of the resist; referring to FIG. 15D(k), thermal flow processing is performed; and referring to FIG. 15D(l), the resulting patterned resists are etched back so as to transfer the shape of the microlenses 5 to color filters.

Note that in the formation of a lens shape in the above-described embodiments, a gray-tone mask 11 may be used to form the shapes of layers constituting each microlens 5, instead of using an existing black and white mask for performing patterning and thermal flow processing.

Furthermore, in the above-described embodiments, decolorization of microlenses 5 by ultraviolet radiation may be performed either before or after the formation of the shape of microlenses 5.

As described above, the present invention is suited for use as a solid-state image sensor having plural photodiodes and as a camera. For example, the present invention is suited for use as: a camera equipped to an image sensor, a digital still camera, a camera-equipped mobile phone, and a notebook personal computer; and a camera unit connected to an information processing device; and others.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A solid-state image sensor in which pixel cells are arranged on a semiconductor substrate,
   wherein each of said pixel cells includes:
   a photoelectric conversion unit operable to perform photoelectric conversion of incident light; and
   a microlens formed above said photoelectric conversion unit, the microlens corresponding to said photoelectric conversion unit,
   wherein said microlens includes a transparent layer and a color filter layer, the color filter layer being disposed under the transparent layer, and
   wherein the color filter layer has an upper surface which is flat in a center and aslope in a periphery.

2. The solid-state image sensor according to claim 1,
   wherein said color filter layer is formed under said transparent layer in a manner that said color filter layer serves as a boffom surface of said microlens, and
   wherein a thickness of said color filter layer in each of said pixel cells is uniform within the center of said color filter layer.

3. The solid-state image sensor according to claim 1,
   wherein said color filter layer is formed under said transparent layer in a manner that said color filter layer serves as a bottom surface of said microlens, and
   wherein said color filter layer in each of said pixel cells is greater in thickness in the center than in the periphery of said color filter layer.

4. The solid-state image sensor according to claim 2,
   wherein a thickness of the center of said color filter layer ranges from a quarter to two-thirds of a thickness of said microlens.

5. A method of manufacturing the solid-state image sensor according to claim 1 said method comprising:
   forming the photoelectric conversion units on the semiconductor substrate;
   forming a flattening film on the photoelectric conversion units; and
   forming, on the flattening film, the microlenses corresponding to the respective photoelectric conversion units.

6. The method of manufacturing the solid-state image sensor according to claim 5,
   wherein said forming of the microlenses includes:
   forming, on the flattening film, patterned color filter resists by patterning a color filter resist;
   forming, on the respective patterned color filter resists, patterned microlens resists by patterning a microlens resist having thermal flow characteristics;
   performing thermal flow processing on the patterned microlens resists so that each of the patterned microlens resists is formed into an upward convex lens shape; and
   etching back the resulting patterned microlens resists and color filter resists so that the microlenses are formed, each of the microlenses including a transparent layer made of the microlens resist and a color filter layer made of the color filter resist.

7. The method of manufacturing the solid-state image sensor according to claim 5,
   wherein said forming of the microlenses includes:
   forming, on the flattening film, patterned color filter resists by patterning a color filter resist;
   forming, on the respective patterned color filter resists, patterned microlens resists by patterning a microlens resist;

forming, on the respective patterned microlens resists, patterned resists by patterning a resist having thermal flow characteristics;

performing thermal flow processing on the patterned resists having thermal flow characteristics so that each of the patterned resists is formed into an upward convex lens shape; and etching back the resulting patterned resists having thermal flow characteristics, microlens resists, and color filter resists so that the microlenses are formed, each of the microlenses including a transparent layer made of the microlens resist and a color filter layer made of the color filter resist.

8. The method of manufacturing the solid-state image sensor according to claim 5, wherein said forming of the microlenses includes:

forming, on the flattening film, patterned color filter resists by patterning a color filter resist;

applying a microlens resist onto the patterned color filter resists and the corresponding photoelectric conversion units;

forming, on the respective patterned microlens resists, patterned resists by patterning a resist having thermal flow characteristics;

performing thermal flow processing on the patterned resists having thermal flow characteristics so that each of the patterned resists is formed into an upward convex lens shape; and etching back the resulting patterned resists having thermal flow characteristics, microlens resists, and color filter resists so that the microlenses are formed, each of the microlenses including a transparent layer made of the microlens resist and a color filter layer made of the color filter resist.

9. The method of manufacturing the solid-state image sensor according to claim 5, wherein said forming of the microlenses includes:

forming, on the flattening film, bottom parts of the respective microlenses by exposing a color filter resist using a gray-tone mask and developing the color filter resist;

forming, on the bottom parts of the respective microlenses, patterned microlens resists by patterning a microlens resist having thermal flow characteristics; and forming top parts of the respective microlenses by performing thermal flow processing on the patterned microlens resists so that each of the patterned microlens resists is formed into an upward convex lens shape.

10. The method of manufacturing the solid-state image sensor according to claim 5, wherein said forming of the microlenses includes:

forming, on the flattening film, bottom parts of the respective microlenses by exposing a color filter resist using a gray-tone mask and developing the color filter resist; and forming, on the bottom parts of the respective microlenses, top parts of the respective microlenses by exposing a microlens resist using a gray-tone mask and developing the microlens resist.

11. The method of manufacturing the solid-state image sensor according to claim 5, wherein said forming of the microlenses includes:

forming, on the flattening film, patterned microlens resists by patterning a microlens resist having thermal flow characteristics;

forming patterned color filter resists by patterning a color filter resist having thermal flow characteristics, the patterned color filter resists being formed in a manner that the patterned color filter resists cover top and side surfaces of the respective patterned microlens resists; and performing thermal flow processing on the patterned microlens resists and color filter resists so that the patterned microlens resists and the corresponding patterned color filter resists are formed into the microlenses with an upward convex lens shape.

12. The method of manufacturing the solid-state image sensor according to claim 5, wherein said forming of the microlenses includes:

forming, on the flattening film, patterned microlens resists by patterning a microlens resist having thermal flow characteristics;

performing thermal flow processing on the patterned microlens resists so that each of the patterned microlens resists is formed into an upward convex lens shape;

forming, on the flattening film and the respective patterned microlens resists, patterned color filter resists by patterning a color filter resist;

forming, on the respective patterned color filter resists, patterned resists by patterning a resist having thermal flow characteristics;

performing thermal flow processing on the patterned resists having thermal flow characteristics so that each of the patterned resists is formed into an upward convex lens shape; and etching back the patterned resists having thermal flow characteristics, color filter resists, and microlens resists so that the microlenses are formed, each of the microlenses including a transparent layer made of the microlens resist and a color filter layer made of the color filter resist.

13. A camera equipped with the solid-state image sensor in which pixel cells are arranged on a semiconductor substrate, wherein each of the pixel cells includes:

a photoelectric conversion unit operable to perform photoelectric conversion of incident light; and a microlens formed above the photoelectric conversion unit, the microlens corresponding to the photoelectric conversion unit, wherein the microlens includes a transparent layer and a color filter layer, the color filter layer being disposed under the transparent layer, and wherein the color filter layer has an upper surface which is flat in a center and aslope in a periphery.

* * * * *